United States Patent
Hotta

(10) Patent No.: US 10,353,010 B2
(45) Date of Patent: Jul. 16, 2019

(54) APPARATUS FOR ESTIMATING REMAINING POWER AMOUNT OF BATTERY EMPLOYING A POLARIZATION VOLTAGE

(71) Applicant: Murata Manufacturing Co., Ltd., Kyoto (JP)

(72) Inventor: Shin Hotta, Kanagawa (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 362 days.

(21) Appl. No.: 14/622,988

(22) Filed: Feb. 16, 2015

(65) Prior Publication Data
US 2015/0241516 A1    Aug. 27, 2015

(30) Foreign Application Priority Data
Feb. 21, 2014    (JP) .................................. 2014-031389

(51) Int. Cl.
  H01M 10/48    (2006.01)
  G01R 31/3835    (2019.01)
  (Continued)

(52) U.S. Cl.
  CPC ....... *G01R 31/3835* (2019.01); *G01R 31/374* (2019.01); *G01R 31/392* (2019.01);
  (Continued)

(58) Field of Classification Search
  CPC .............. G01R 31/362; G01R 31/3655; G01R 31/3675; G01R 31/3679; H01M 10/486; H01M 10/482; H01M 10/48
  (Continued)

(56) References Cited

U.S. PATENT DOCUMENTS

| | | | | |
|---|---|---|---|---|
| 4,816,352 A | * | 3/1989 | Gordon | H01M 6/04 429/120 |
| 5,652,069 A | * | 7/1997 | Sakai | G01R 31/3648 320/136 |

(Continued)

FOREIGN PATENT DOCUMENTS

| | | |
|---|---|---|
| JP | 2002-295775 | 10/2002 |
| JP | 2005227164 A * | 8/2005 |
| JP | 2014181924 A * | 9/2014 | ............ H01M 10/48 |

OTHER PUBLICATIONS

European Office Action dated May 29, 2018 in corresponding European Application No. 15 154 897.1.

(Continued)

*Primary Examiner* — Robert J Grant
*Assistant Examiner* — John T Trischler
(74) *Attorney, Agent, or Firm* — K&L Gates LLP

(57) ABSTRACT

There is provided a battery remaining-life estimation apparatus that includes a memory, and a circuit. The memory is configured to store information about a polarization-voltage curve of a secondary battery, the information being stored with a correlation with a current value and a temperature of the secondary battery. The circuit is configured to estimate a remaining power of the secondary battery, the remaining power being estimated based on a discharge curve of the secondary battery. The circuit obtains the polarization-voltage curve based on the information in the memory, the polarization-voltage curve being correlated with the current value and the temperature of the secondary battery. The circuit also estimates the discharge curve by subtracting the obtained polarization-voltage curve from an open-circuit voltage curve obtained for the secondary battery.

5 Claims, 14 Drawing Sheets

(51) Int. Cl.
*G01R 31/374* (2019.01)
*G01R 31/392* (2019.01)
*H01M 10/0525* (2010.01)

(52) U.S. Cl.
CPC ......... *H01M 10/48* (2013.01); *H01M 10/482* (2013.01); *H01M 10/486* (2013.01); *H01M 10/0525* (2013.01); *H01M 2220/20* (2013.01); *Y02E 60/122* (2013.01)

(58) Field of Classification Search
USPC ....................................................... 320/149
See application file for complete search history.

(56) References Cited

U.S. PATENT DOCUMENTS

| | | | | |
|---|---|---|---|---|
| 5,654,623 | A * | 8/1997 | Shiga | G01R 31/3648 320/106 |
| 5,672,951 | A * | 9/1997 | Shiota | G01R 31/361 320/132 |
| 6,064,182 | A * | 5/2000 | Eguchi | G01R 31/362 320/132 |
| 6,495,989 | B1 * | 12/2002 | Eguchi | G01R 31/3662 320/130 |
| 6,608,482 | B2 * | 8/2003 | Sakai | B60K 6/445 320/132 |
| 6,611,128 | B2 * | 8/2003 | Minamiura | B60L 3/0023 320/134 |
| 6,624,636 | B2 * | 9/2003 | Arai | B60K 6/22 324/426 |
| 6,661,231 | B1 * | 12/2003 | Arai | G01R 31/3624 320/132 |
| 6,759,832 | B2 * | 7/2004 | Minamiura | B60L 3/0023 320/150 |
| 6,794,876 | B2 * | 9/2004 | Kawaguchi | B60L 11/1851 324/426 |
| 6,812,670 | B2 * | 11/2004 | Minamiura | G01R 31/3658 320/116 |
| 6,850,038 | B2 * | 2/2005 | Arai | H01M 10/48 320/132 |
| 7,034,504 | B2 * | 4/2006 | Arai | G01R 31/3648 320/132 |
| 7,154,247 | B2 * | 12/2006 | Kikuchi | G01R 19/16542 320/132 |
| 7,339,351 | B2 * | 3/2008 | Murakami | B60L 3/0046 320/132 |
| 7,355,411 | B2 * | 4/2008 | Murakami | G01R 31/362 320/107 |
| 7,456,612 | B2 * | 11/2008 | Murakami | B60L 3/0046 320/132 |
| 7,492,126 | B2 * | 2/2009 | Hogari | G01R 31/3624 320/132 |
| 7,498,772 | B2 * | 3/2009 | Palladino | H01M 10/486 320/132 |
| 7,508,170 | B2 * | 3/2009 | Iida | H02J 7/0029 320/134 |
| 7,514,905 | B2 * | 4/2009 | Kawahara | B60L 11/1864 320/150 |
| 7,528,575 | B2 * | 5/2009 | Murakami | G01R 31/362 320/132 |
| 7,557,584 | B2 * | 7/2009 | Murakami | G01R 31/3624 320/132 |
| 7,570,021 | B2 * | 8/2009 | Togashi | B60K 6/445 320/130 |
| 7,622,894 | B2 * | 11/2009 | Kawahara | G01R 31/3624 320/127 |
| 7,629,770 | B2 * | 12/2009 | Iida | B60L 11/1868 320/134 |
| 7,630,842 | B2 * | 12/2009 | Murakami | G01R 31/3651 320/127 |
| 7,679,328 | B2 * | 3/2010 | Mizuno | G01R 31/361 320/132 |
| 7,701,174 | B2 * | 4/2010 | Schoch | G01R 31/3651 320/127 |
| 7,728,598 | B2 * | 6/2010 | Murakami | G01R 31/3624 320/132 |
| 7,750,640 | B2 * | 7/2010 | Yamabe | G01R 31/3624 320/132 |
| 7,847,429 | B2 * | 12/2010 | Miyama | H02J 7/1423 307/9.1 |
| 7,976,581 | B2 * | 7/2011 | Choi | B60L 11/12 180/65.29 |
| 8,000,915 | B2 * | 8/2011 | Furukawa | G01R 31/362 702/63 |
| 8,004,239 | B2 * | 8/2011 | Kawahara | B60L 11/1864 320/128 |
| 8,054,045 | B2 * | 11/2011 | Kawahara | G01R 31/3624 320/127 |
| 8,058,835 | B2 * | 11/2011 | Togashi | B60L 3/0046 307/10.1 |
| 8,082,116 | B2 * | 12/2011 | Chen | G01R 31/3679 320/132 |
| 8,085,051 | B2 * | 12/2011 | Iida | H01M 10/48 324/433 |
| 8,102,146 | B2 * | 1/2012 | Suzuki | G01R 31/3624 320/107 |
| 8,103,485 | B2 * | 1/2012 | Plett | H01M 10/48 703/2 |
| 8,148,993 | B2 * | 4/2012 | Yamabe | B60K 6/365 324/433 |
| 8,154,299 | B2 * | 4/2012 | Iida | G01R 31/3679 320/132 |
| 8,159,186 | B2 * | 4/2012 | Iida | B66B 5/027 307/43 |
| 8,315,755 | B2 * | 11/2012 | Hirata | B60K 6/365 180/65.28 |
| 8,374,807 | B2 * | 2/2013 | Hall | G01R 31/3624 702/63 |
| 8,380,452 | B2 * | 2/2013 | Maegawa | G01R 31/3658 320/134 |
| 8,415,954 | B2 * | 4/2013 | Akamine | G01R 31/361 320/132 |
| 8,487,630 | B2 * | 7/2013 | Mori | G01R 31/3679 320/116 |
| 8,773,076 | B2 * | 7/2014 | Choi | H02J 3/32 320/139 |
| 8,947,023 | B2 * | 2/2015 | Kawahara | H01M 10/486 318/139 |
| 9,014,866 | B2 * | 4/2015 | Moriai | H02J 7/0013 700/286 |
| 9,086,463 | B2 * | 7/2015 | Tamura | G01R 31/3679 |
| 9,157,966 | B2 * | 10/2015 | Papana | G01R 31/3644 |
| 9,166,421 | B2 * | 10/2015 | Tsuruta | H02J 7/0031 |
| 9,184,613 | B2 * | 11/2015 | Yokoyama | G01R 31/3624 |
| 9,276,422 | B2 * | 3/2016 | Hotta | H01M 10/425 |
| 9,475,480 | B2 * | 10/2016 | Ishishita | B60L 11/1862 |
| 9,537,325 | B2 * | 1/2017 | Igarashi | H02J 7/00 |
| 9,581,650 | B2 * | 2/2017 | Hotta | G01R 31/3651 |
| 9,627,718 | B2 * | 4/2017 | Inaba | H02J 7/0024 |
| 9,634,314 | B2 * | 4/2017 | Marutani | H01M 2/34 |
| 9,709,634 | B2 * | 7/2017 | Tsujimoto | G01R 31/362 |
| 9,720,047 | B2 * | 8/2017 | Joe | B60L 58/12 |
| 9,745,723 | B2 * | 8/2017 | Inoue | E02F 9/26 |
| 10,094,882 | B2 * | 10/2018 | Kawai | G01R 31/367 |
| 10,120,032 | B2 * | 11/2018 | Akamine | H01M 10/48 |
| 2002/0113595 | A1 * | 8/2002 | Sakai | B60K 6/445 324/433 |
| 2002/0145430 | A1 * | 10/2002 | Arai | B60K 6/22 324/426 |
| 2003/0042866 | A1 * | 3/2003 | Minamiura | G01R 31/3658 320/104 |
| 2003/0052646 | A1 * | 3/2003 | Minamiura | B60L 3/0023 320/122 |
| 2003/0178970 | A1 * | 9/2003 | Minamiura | B60L 3/0023 320/116 |
| 2003/0210056 | A1 * | 11/2003 | Arai | G01R 31/3648 324/430 |

(56) References Cited

U.S. PATENT DOCUMENTS

| | | | | |
|---|---|---|---|---|
| 2004/0008031 A1* | 1/2004 | Arai | H01M 10/48 | 324/429 |
| 2004/0119445 A1* | 6/2004 | Wakeman | G01R 31/362 | 320/156 |
| 2004/0178798 A1* | 9/2004 | Kikuchi | G01R 19/16542 | 324/426 |
| 2004/0257087 A1* | 12/2004 | Murakami | B60L 3/0046 | 324/426 |
| 2005/0017725 A1* | 1/2005 | Murakami | B60L 3/0046 | 324/426 |
| 2005/0024020 A1* | 2/2005 | Hogari | G01R 31/3624 | 320/132 |
| 2005/0073315 A1* | 4/2005 | Murakami | G01R 31/362 | 324/433 |
| 2006/0046135 A1* | 3/2006 | Huang | H01M 4/06 | 429/128 |
| 2006/0145702 A1* | 7/2006 | Schoch | G01R 31/3651 | 324/429 |
| 2006/0202857 A1* | 9/2006 | Kawahara | G01R 31/3624 | 340/870.02 |
| 2006/0273802 A1* | 12/2006 | Murakami | G01R 31/3658 | 324/434 |
| 2007/0052423 A1* | 3/2007 | Arai | G01R 31/3651 | 324/429 |
| 2007/0075686 A1* | 4/2007 | Togashi | B60K 6/445 | 320/130 |
| 2007/0090805 A1* | 4/2007 | Mizuno | G01R 31/361 | 320/132 |
| 2007/0126404 A1* | 6/2007 | Iida | B60L 11/1868 | 320/136 |
| 2007/0138998 A1* | 6/2007 | Togashi | B60L 3/0046 | 320/104 |
| 2007/0145954 A1* | 6/2007 | Kawahara | B60L 11/1864 | 320/150 |
| 2007/0216358 A1* | 9/2007 | Iida | H02J 7/0029 | 320/129 |
| 2007/0236181 A1* | 10/2007 | Palladino | H01M 10/486 | 320/130 |
| 2008/0147259 A1* | 6/2008 | Choi | B60L 11/12 | 701/22 |
| 2008/0157777 A1* | 7/2008 | Yamabe | G01R 31/3648 | 324/426 |
| 2008/0162059 A1* | 7/2008 | Murakami | G01R 31/3651 | 702/63 |
| 2008/0234956 A1* | 9/2008 | Mizuno | G01R 31/3651 | 702/63 |
| 2009/0024338 A1* | 1/2009 | Suzuki | G01R 31/3651 | 702/63 |
| 2009/0174369 A1* | 7/2009 | Kawahara | B60L 11/1864 | 320/150 |
| 2009/0248334 A1* | 10/2009 | Sans | G01R 31/3651 | 702/63 |
| 2009/0261836 A1* | 10/2009 | Murakami | G01R 31/3624 | 324/429 |
| 2009/0271132 A1* | 10/2009 | Furukawa | G01R 31/362 | 702/63 |
| 2010/0001693 A1* | 1/2010 | Iida | G01R 31/3679 | 320/134 |
| 2010/0026244 A1* | 2/2010 | Iida | B66B 5/027 | 320/134 |
| 2010/0030499 A1* | 2/2010 | Kawahara | G01R 31/3624 | 702/63 |
| 2010/0057385 A1* | 3/2010 | Iida | H02J 7/0021 | 702/58 |
| 2010/0066379 A1* | 3/2010 | Iida | H02J 7/0021 | 324/434 |
| 2010/0121591 A1* | 5/2010 | Hall | G01R 31/3651 | 702/63 |
| 2010/0174417 A1* | 7/2010 | Iida | H01M 10/425 | 700/292 |
| 2010/0250163 A1* | 9/2010 | Maegawa | G01R 31/3624 | 702/63 |
| 2010/0318252 A1* | 12/2010 | Izumi | B60W 20/13 | 701/22 |
| 2011/0084702 A1* | 4/2011 | Mori | G01R 31/3679 | 324/430 |
| 2011/0127958 A1* | 6/2011 | Ishishita | B60L 11/1862 | 320/109 |
| 2011/0156713 A1* | 6/2011 | Akamine | G01R 31/361 | 324/433 |
| 2011/0313602 A1* | 12/2011 | Hirata | B60K 6/365 | 701/22 |
| 2012/0029851 A1* | 2/2012 | Nakayama | G01R 31/3624 | 702/63 |
| 2012/0072042 A1* | 3/2012 | Moriai | H02J 7/0013 | 700/297 |
| 2012/0200264 A1 | 8/2012 | Choi et al. | | |
| 2012/0248876 A1* | 10/2012 | Tamura | G01R 31/3679 | 307/66 |
| 2012/0256569 A1* | 10/2012 | Kawahara | H01M 10/486 | 318/139 |
| 2013/0127424 A1 | 5/2013 | Tsuruta et al. | | |
| 2013/0138369 A1* | 5/2013 | Papana | G01R 31/3644 | 702/63 |
| 2013/0154544 A1* | 6/2013 | Yokoyama | G01R 31/3624 | 320/105 |
| 2013/0171481 A1* | 7/2013 | Hotta | H01M 10/4207 | 429/50 |
| 2013/0177783 A1* | 7/2013 | Marutani | H01M 2/1077 | 429/7 |
| 2013/0181721 A1* | 7/2013 | Ozawa | H01M 2/1077 | 324/434 |
| 2013/0300370 A1* | 11/2013 | Hotta | H01M 10/425 | 320/117 |
| 2013/0317697 A1* | 11/2013 | Hotta | G01R 31/3651 | 701/34.4 |
| 2014/0055100 A1* | 2/2014 | Igarashi | H02J 7/00 | 320/152 |
| 2014/0184236 A1* | 7/2014 | Ohkawa | G01R 31/362 | 324/433 |
| 2014/0214253 A1* | 7/2014 | Inoue | E02F 9/26 | 701/22 |
| 2014/0354213 A1* | 12/2014 | Rivera-Poventud | H02J 7/0068 | 320/107 |
| 2015/0028878 A1* | 1/2015 | Tsujimoto | G01R 33/096 | 324/426 |
| 2015/0046108 A1* | 2/2015 | Akamine | H01M 10/48 | 702/63 |
| 2015/0084639 A1* | 3/2015 | Joe | G01R 31/3651 | 324/428 |
| 2015/0112622 A1* | 4/2015 | Uchino | G01R 19/0084 | 702/64 |
| 2015/0127186 A1* | 5/2015 | Moriai | H02J 7/0013 | 700/297 |
| 2015/0364797 A1* | 12/2015 | Inaba | H02J 7/0024 | 429/61 |
| 2016/0083932 A1* | 3/2016 | Inoue | E02F 9/26 | 701/22 |
| 2016/0187429 A1* | 6/2016 | Kawai | G01R 31/3651 | 702/63 |
| 2016/0356856 A1* | 12/2016 | Hongo | G01R 31/3634 | |
| 2017/0131360 A1* | 5/2017 | Kawahara | G01R 31/3651 | |
| 2017/0141444 A1* | 5/2017 | Kawahara | H01M 10/4285 | |
| 2017/0184683 A1* | 6/2017 | Kobayashi | G01R 31/3658 | |
| 2018/0196107 A1* | 7/2018 | Fleischer | G01R 31/025 | |

OTHER PUBLICATIONS

Song Kim, A Technique for Estimating the State of Health of Lithium Batteries Through a Dual-Sliding-Mode Observer, IEEE Transaction on Power Electronics, vol. 25, No. 4, Apr. 2010.

* cited by examiner

| Temperature \ Current value | | $I_1$ | $I_2$ | $I_3$ | ⋮ |
|---|---|---|---|---|---|
| $T_1$ | $a_1, b_1$ | $p_{111}, p_{112}, p_{113}$ | $p_{121}, p_{122}, p_{123}$ | $p_{131}, p_{132}, p_{133}$ | ⋯ |
| $T_2$ | $a_2, b_2$ | $p_{211}, p_{212}, p_{213}$ | $p_{221}, p_{222}, p_{223}$ | $p_{231}, p_{232}, p_{233}$ | ⋯ |
| $T_3$ | $a_3, b_3$ | $p_{311}, p_{312}, p_{313}$ | $p_{321}, p_{322}, p_{323}$ | $p_{331}, p_{332}, p_{333}$ | ⋯ |
| ⋮ | | ⋯ | ⋯ | ⋯ | |

FIG.3

| Capacity retention : $R_1$ | | | | |
|---|---|---|---|---|
| Temperature \ Current value | $I_1$ | $I_2$ | $I_3$ | ... |
| $T_1$ | $a_{11}, b_{11}$ | $p_{1111}, p_{1112}, p_{1113}$ | $p_{1211}, p_{1212}, p_{1213}$ | $p_{1311}, p_{1312}, p_{1313}$ | ... |
| $T_2$ | $a_{21}, b_{21}$ | $p_{2111}, p_{2112}, p_{2113}$ | $p_{2211}, p_{2212}, p_{2213}$ | $p_{2311}, p_{2312}, p_{2313}$ | ... |
| $T_3$ | $a_{31}, b_{31}$ | $p_{3111}, p_{3112}, p_{3113}$ | $p_{3211}, p_{3212}, p_{3213}$ | $p_{3311}, p_{3312}, p_{3313}$ | ... |
| ... | ... | ... | ... | ... |

FIG.5

APPARATUS FOR ESTIMATING REMAINING POWER AMOUNT OF BATTERY EMPLOYING A POLARIZATION VOLTAGE

CROSS REFERENCES TO RELATED APPLICATIONS

The present application claims priority to Japanese Priority Patent Application JP 2014-031389 filed in the Japan Patent Office on Feb. 21, 2014, the entire content of which is hereby incorporated by reference.

BACKGROUND

The present disclosure relates to battery remaining-life estimation apparatuses, battery packs, capacitors, electric vehicles, and battery remaining-life estimation methods and, more specifically, to a battery remaining-life estimation apparatus that estimates the remaining life of a secondary battery, a battery pack, a capacitor, an electric vehicle, and a battery remaining-life estimation method.

There has been a technology of estimating the remaining life of a secondary battery. As an example, Japanese Patent Application Laid-Open Publication No. 2002-295775 describes a technology of computing the capacity of a battery currently available for discharging until the voltage reaches a discharge-ending value, i.e., computing the present capacity. Such a present capacity is computed based on the discharge characteristics stored in advance and a total charge-discharge amount calculated in advance. The discharge characteristics are about the relationship between a discharge voltage and a charge-discharge amount.

SUMMARY

There has been a demand to estimate the remaining life of a secondary battery with a high accuracy considering the discharge characteristics thereof, i.e., the dependence on temperature and current.

It is thus desirable to provide a battery remaining-life estimation apparatus that estimates the remaining life of a secondary battery with a high accuracy, a battery pack, a capacitor, an electric vehicle, and a battery remaining-life estimation method.

According to an embodiment of the present disclosure, there is provided a battery remaining-life estimation apparatus that includes a memory, and a circuit. The memory is configured to store information about a polarization-voltage curve of a secondary battery, the information being stored with a correlation with a current value and a temperature of the secondary battery. The circuit is configured to estimate a remaining power of the secondary battery, the remaining power being estimated based on a discharge curve of the secondary battery. The circuit obtains the polarization-voltage curve based on the information in the memory, the polarization-voltage curve being correlated with the current value and the temperature of the secondary battery. The circuit also estimates the discharge curve by subtracting the obtained polarization-voltage curve from an open-circuit voltage curve obtained for the secondary battery.

The expression of "curve" in the present disclosure is not restricted to a curved line including no linear portion, and may be a combination of a straight line and a curve, a combination of straight lines, i.e., zigzag line, or a straight line.

The memory may store a plurality of typical parameters as the information about the polarization-voltage curve, the parameters defining a shape of the polarization-voltage curve. The circuit may estimate the polarization-voltage curve based on the typical parameters, the parameters being correlated with the current value and the temperature of the secondary battery.

In such a configuration, for a first curve portion of the polarization-voltage curve where a voltage change responding to a change in amount of charge is small, the memory may store a proportional coefficient and a constant component as the typical parameters, the proportional coefficient being of a component proportional to a discharge current. For a second curve portion of the polarization-voltage curve where the voltage change is large, the memory may store a parameter defining a shape of a curve as the typical parameters, the curve being obtained by differentiating the second curve portion with respect to the amount of charge.

Also in the above configuration, as the parameter defining the shape of the curve obtained by differentiating the second curve portion with respect to the amount of charge, the memory may store a parameter defining a characteristic of the shape of the curve obtained by differentiating the second curve portion with respect to the amount of charge.

The memory may also store the information about the polarization-voltage curve also with a correlation with capacity retention of the secondary battery.

Alternatively, the circuit may estimate the remaining power based on a temperature change of the secondary battery?.

Still alternatively, the circuit may obtain the polarization-voltage curve based on current and temperature information of the secondary battery, the information being obtained by communication.

According to another embodiment of the present disclosure, there is provided a battery pack that includes a secondary battery, and a battery remaining-life estimation apparatus that includes a memory, and a circuit. The memory is configured to store information about a polarization-voltage curve of the secondary battery, the information being stored with a correlation with a current value and a temperature of the secondary battery. The circuit is configured to estimate a remaining power of the secondary battery, the remaining power being estimated based on a discharge curve of the secondary battery. The circuit obtains the polarization-voltage curve based on the information in the memory, the polarization-voltage curve being correlated with the current value and the temperature of the secondary battery. The circuit also estimates the discharge curve by subtracting the obtained polarization-voltage curve from an open-circuit voltage curve obtained for the secondary battery.

According to still another embodiment of the present disclosure, there is provided a capacitor that includes a secondary battery, and a battery remaining-life estimation apparatus that includes a memory, and a circuit. The memory is configured to store information about a polarization-voltage curve of the secondary battery, the information being stored with a correlation with a current value and a temperature of the secondary battery. The circuit is configured to estimate a remaining power of the secondary battery, the remaining power being estimated based on a discharge curve of the secondary battery. The circuit obtains the polarization-voltage curve based on the information in the memory, the polarization-voltage curve being correlated with the current value and the temperature of the secondary battery, estimates the discharge curve by subtracting the obtained polarization-voltage curve from an open-circuit voltage curve obtained for the secondary battery, and supplies a power to a connected power consumption device.

According to still another embodiment of the present disclosure, there is provided an electric vehicle that includes a secondary battery, a battery remaining-life estimation apparatus including a memory, and a circuit, and a transducer. The memory is configured to store information about a polarization-voltage curve of the secondary battery, the information being stored with a correlation with a current value and a temperature of the secondary battery. The circuit is configured to estimate a remaining power of the secondary battery, the remaining power being estimated based on a discharge curve of the secondary battery. The transducer is configured to convert a power into a driving force for the vehicle, the power being supplied from the secondary battery. The circuit obtains the polarization-voltage curve based on the information in the memory, the polarization-voltage curve being correlated with the current value and the temperature of the secondary battery. The circuit also estimates the discharge curve by subtracting the obtained polarization-voltage curve from an open-circuit voltage curve obtained for the secondary battery.

According to still another embodiment of the present disclosure, there is provided a battery remaining-life estimation method that includes obtaining a polarization-voltage curve corresponding to a current value and a temperature of a secondary battery based on information thereabout stored in a memory, the information being stored with a correlation with the current value and the temperature of the secondary battery, estimating a discharge curve of the secondary battery by subtracting the obtained polarization-voltage curve from an open-circuit voltage curve obtained for the secondary battery, and estimating a remaining power of the secondary battery based on the discharge curve.

In the battery remaining-life estimation method, the polarization-voltage curve of the secondary battery may be actually measured, a shape of a curve may be linearly approximated, the curve being obtained by differentiating a portion of the actually-measured polarization-voltage curve with respect to an amount of charge, the portion being regarded as being large in voltage change responding to a change in amount of charge, and a parameter typifying the linearly-approximated shape may be stored in the memory as a part of the information about the polarization-voltage curve.

Also in the battery remaining-life estimation method, as the parameter typifying the linearly-approximated shape, a parameter corresponding to an end point or a node in the linearly-approximated shape may be stored.

According to the embodiments of the present disclosure, the remaining-life of a secondary battery can be estimated with a high accuracy.

These and other objects, features and advantages of the present disclosure will become more apparent in light of the following detailed description of best mode embodiments thereof, as illustrated in the accompanying drawings.

Additional features and advantages are described herein, and will be apparent from the following Detailed Description and the figures.

BRIEF DESCRIPTION OF THE FIGURES

FIG. 3 is a schematic diagram of parameters stored in a memory as an exemplary configuration of a battery remaining-life estimation apparatus in a second embodiment of the present disclosure;

FIG. 5 is a schematic diagram of parameters stored in a memory as an exemplary configuration of a battery remaining-life estimation apparatus in a first modified example of the second embodiment of the present disclosure;

DETAILED DESCRIPTION

Figure 1:
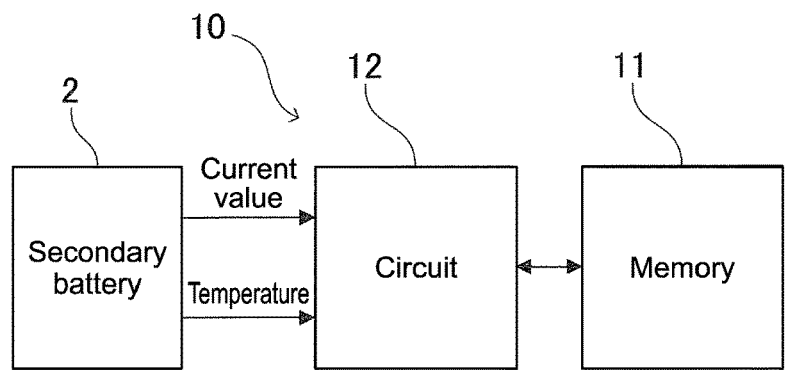
FIG. 1 is a block diagram schematically showing an exemplary configuration of a battery remaining-life estimation apparatus in a first embodiment of the present disclosure.

Hereinafter, preferred embodiments of the present disclosure will be described with reference to the accompanying drawings. The embodiments that will be described below are intended for purposes of typical illustration only and are not intended to limit the scope of the present disclosure. In the embodiments, any components corresponding to each other are provided with the same reference numeral, and are not described twice. The description is given in the following order.

1. First Embodiment
   (an exemplary battery remaining-life estimation apparatus of estimating a discharge curve based on information stored in a memory about a polarization-voltage curve, and based on the estimated discharge curve, estimating the remaining life of a secondary battery)
2. Second Embodiment
   (an exemplary battery remaining-life estimation apparatus storing typical parameters in a memory with a correlation with the current value and the temperature of a secondary battery to define the shape of a polarization-voltage curve)
3. First Modified Example of Second Embodiment
   (an exemplary battery remaining-life estimation apparatus storing typical parameters in a memory with a correlation with the capacity retention of a secondary battery to define the shape of a polarization-voltage curve)
4. Third Embodiment
   (an exemplary battery remaining-life estimation apparatus storing the proportional coefficient of a component proportional to a discharge current and a constant for a first curve portion of a polarization-voltage curve, and for a second curve portion thereof, storing parameters defining the shape of a curve obtained by differentiating the second curve portion)
5. First Modified Example of Third Embodiment
   (an exemplary battery remaining-life estimation apparatus storing parameters defining characteristics of the shape obtained by differentiating the second curve portion)
6. Fourth Embodiment
   (an exemplary battery remaining-life estimation apparatus storing parameters typifying the linear-approximated shape obtained by differentiating a portion where a voltage change is large in an actual-measured polarization-voltage curve)
7. Fifth Embodiment
   (an exemplary battery remaining-life estimation apparatus estimating the remaining life of a secondary battery based on an estimated temperature change thereof)
8. Sixth Embodiment
   (an exemplary battery remaining-life estimation apparatus estimating the remaining life of a secondary battery based on information thereabout obtained through communication, i.e., current, temperature, and voltage information)
9. Seventh Embodiment
   (an exemplary capacitor including a battery remaining-life estimation apparatus as a battery pack)
10. Eighth Embodiment
    (an exemplary electric vehicle including a battery remaining-life estimation apparatus)

1. First Embodiment

[Exemplary Configuration of Apparatus]

FIG. 1 is a block diagram schematically showing an exemplary configuration of a battery remaining-life estimation apparatus 10 in a first embodiment. As shown in FIG. 1, the battery remaining-life estimation apparatus 10 includes a memory 11, and a circuit 12. The circuit 12 is able to read data stored in the memory 11. The circuit 12 is configured to use the data read from the memory 11 to perform a process to estimate the remaining life of a secondary battery 2. The memory 11 is not specifically restrictive, and may be a main storage such as ROM (Read Only Memory), or may be an external storage such as hard disk. The circuit 12 is also not specifically restrictive, and may include an electronic circuit or others. The electronic circuit may include a digital circuit. The circuit 12 may include a processor such as CPU (Central Processing Unit), or an MPU (Micro-Processing Unit). A program to be run by the circuit 12, i.e., battery remaining-life estimation program, may be stored in a storage such as ROM. For running the battery remaining-life estimation program, the circuit 12 may use a storage such as RAM (Random Access Memory) as a work area. The storage for the battery remaining-life estimation program, or the storage for use as a work area may be included in the circuit 12 or be provided separately therefrom. The case where the memory 11 serves also as a main storage storing the battery remaining-life estimation program is also within the scope of the present disclosure. The secondary battery 2 is also not restricted by type, and a lithium-ion secondary battery is a possibility for use. The present disclosure is effectively applicable also to a secondary battery having the discharge characteristics being flat, e.g., lithium-ion secondary battery whose cathode is made of olivine-type iron phosphate.

[Memory 11]

The memory 11 stores information about a polarization-voltage curve of the secondary battery 2 with a correlation with a current value and a temperature thereof. Herein, this polarization-voltage-curve information may be obtained based on polarization-voltage curves actually measured for each combination of the current value and the temperature of the secondary battery 2. The polarization-voltage-curve information may also be correlated with a state value of the secondary battery 2 other than the current value and the temperature thereof. The polarization-voltage-curve information may be data in the table. The polarization-voltage-curve information is not specifically restrictive as long as the information helps the circuit 12 to reproduce the polarization-voltage curve together with the state value of the secondary battery 2. The polarization-voltage-curve information may be about the characteristics of a polarization voltage, i.e., how a polarization voltage shows a change against a change in amount of discharge. The polarization-voltage-curve information may be about the shape of the polarization-voltage curve itself, or about the shape of a curve obtained by performing computation on the polarization-voltage curve. The number of pieces of the polarization-voltage curve is not restricted to one.

[Circuit 12]

The circuit 12 is configured to estimate the remaining power of the secondary battery 2 based on a discharge curve of the secondary battery 2. The circuit 12 uses the information in the memory 11 as a basis to obtain a polarization-voltage curve corresponding to the current value and the temperature of the secondary battery 2. The circuit 12 estimates a discharge curve by subtracting the polarization-voltage curve obtained as above from an open-circuit voltage (OCV) curve obtained for the secondary battery 2. The circuit 12 calculates, i.e., estimates, the remaining power of the secondary battery 2 by integrating a segment of the discharge curve estimated as above, i.e., the segment from the present total value of current to the discharge-ending voltage.

The circuit 12 may obtain the current value of the secondary battery 2 from a current measuring unit disposed in a charge-discharge circuit of the secondary battery 2. Moreover, the circuit 12 may obtain the temperature of the secondary battery 2 from a temperature measuring unit disposed in the secondary battery 2.

The circuit 12 may obtain the open-circuit voltage curve by reading information thereabout stored in the memory 11. If this is the case, this open-circuit-voltage-curve information may be about an open-circuit-voltage curve actually measured for the secondary battery 2 being brand new.

Alternatively, the circuit 12 may obtain the open-circuit voltage curve by calculating an open-circuit voltage of the secondary battery 2. If this is the case, the circuit 12 may use voltage data as a basis to calculate the open-circuit voltage. The voltage data is about a voltage when the current value of the secondary battery 2 is 0 A. Hereinafter, such voltage data is referred to as open-circuit voltage data. To be more specific, the circuit 12 may count the time to accumulate the open-circuit voltage data for a fixed length of time, and may fit a voltage decrease since the time of 0 second using Equation 1 below.

$$A(1-e^{-Bt}) \quad \text{[Equation 1]}$$

In Equation 1, t denotes a time, and A and B are each a fitting parameter. The circuit 12 may subtract the fitting parameter of A from the voltage at the time of 0 second, and use the resulting value as a calculated open-circuit voltage. Thereafter, every time the discharge capacity shows a change, the circuit 12 may store the calculated open-circuit voltage together with the discharge capacity as of the point in time so as to obtain the open-circuit voltage curve. When storing the open-circuit voltage and the discharge capacity, the circuit 12 may store data thereabout in the memory 11 with a correlation therebetween. The discharge capacity may be calculated by adding the product of values to the last-calculated discharge capacity, i.e., the product of a value of current data and an elapsed time since when the last current data is obtained.

The method to obtain the open-circuit voltage curve is not restricted to the above. As an example, an open-circuit voltage may be calculated only for a limited range of the entire SOC (State Of Charge) range so as to obtain an open-circuit voltage curve only for the limited range. Thereafter, open-circuit voltage curves obtained in advance, i.e., an open-circuit voltage curve for the cathode of the secondary battery 2 and that for the anode thereof, may be changed in the capacity direction relative to the open-circuit voltage curve obtained for the limited range, thereby fitting a difference between the open-circuit voltage curves for the cathode and anode. Such a fitting may be performed as a part of a process of estimating the degree of capacity deterioration in the secondary battery 2. The open-circuit voltage curve for the cathode may be obtained by intermittent discharge with respect to a first coin battery whose cathode is made of the same material as the cathode of the secondary battery 2, and whose anode is a charge carrier such as metal lithium. For the intermittent discharge, used are a predetermined discharge-of-depth (DOD) interval and a predetermined discharge-suspended time interval. The open-circuit voltage curve for the anode may be obtained by intermittent discharge with respect to a second coin battery whose cathode is made of the same material as the anode of the secondary battery 2, and whose anode is a charge carrier. For the intermittent discharge, used are also the predetermined discharge-of-depth interval and the predetermined discharge-suspended time interval. The fitting may be performed by finding a difference between the open-circuit voltage curves for the cathode and anode that are considered best matched to the open-circuit voltage curve for the limited capacity range. After the fitting, the difference between the open-circuit voltage curves for the cathode and anode may be used as the eventual calculation result for the open-circuit voltage curve. This may reduce the time to obtain an open-circuit voltage curve compared with when the open-circuit voltage is directly measured for the entire SOC range.

[Exemplary Operation of Apparatus]

Figure 2:
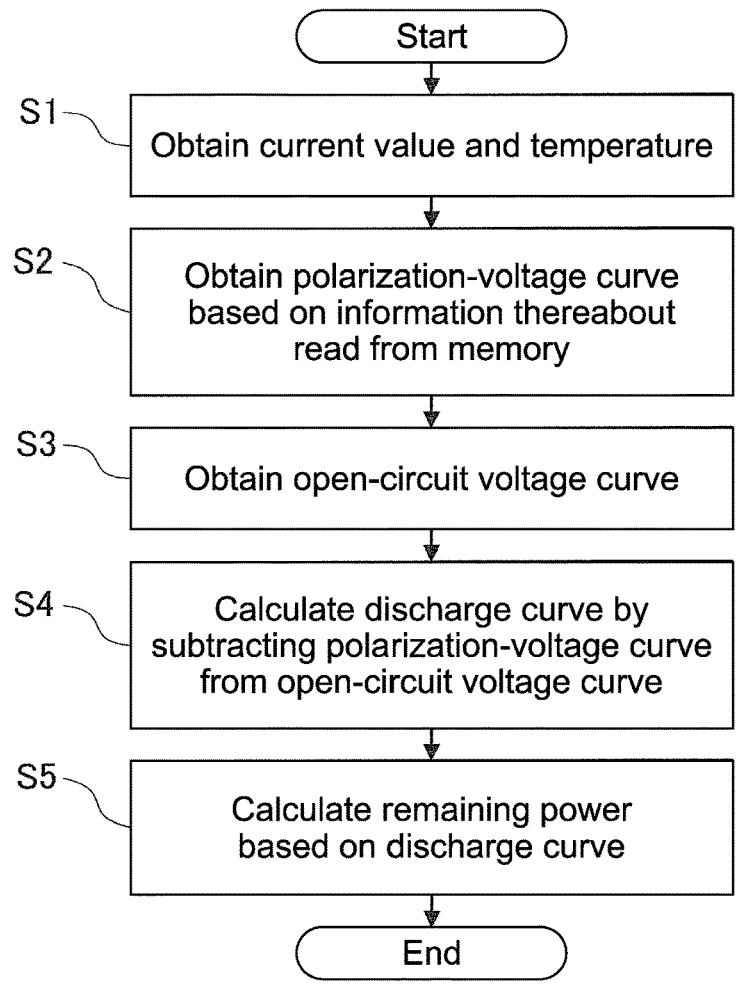
FIG. 2 is an exemplary operation flowchart of the battery remaining-life estimation apparatus in the first embodiment of the present disclosure.

FIG. 2 is an exemplary operation flowchart of the battery remaining-life estimation apparatus 10 in the first embodiment. The exemplary operation flowchart of FIG. 2 is a battery remaining-life estimation method in an embodiment of the present disclosure. This battery remaining-life estimation method may be embodied by any configuration other than the battery remaining-life estimation apparatus 10.

In FIG. 2, first of all, the circuit 12 obtains a current value and a temperature of the secondary battery 2 in step 1 (S1).

Then in step 2 (S2), the circuit 12 reads information from the memory 11 about a polarization-voltage curve corresponding to the current value and the temperature obtained in step 1 (S1). The circuit 12 then obtains the polarization-voltage curve based on the information thereabout.

Then in step 3 (S3), the circuit 12 obtains an open-circuit voltage curve for the secondary battery 2. Herein, step 3 (S3) may be performed before step 2 (S2).

Then in step 4 (S4), the circuit 12 subtracts the polarization-voltage curve obtained in step 2 (S2) from the open-circuit voltage curve obtained in step 3 (S3) so as to calculate, i.e., estimate, a discharge curve for the secondary battery 2.

Then in step 5 (S5), the circuit 12 uses the discharge curve obtained in step 4 (S4) as a basis to calculate, i.e., estimate, the remaining power of the secondary battery 2. This is the end of the process.

With the battery remaining-life estimation apparatus 10 in the first embodiment, the remaining-life to be estimated for the second battery 2 is not the amount of charge [Ah] thereof but the remaining power [Wh] thereof so that the remaining life of the secondary battery 2 is estimated with a high accuracy.

Herein, because the battery voltage is reduced as the secondary battery keeps discharging, a constant power consumption may cause a gradual increase in current consumption. This thus varies the amount of power obtained from the same amount of consumed charge between when the battery is fully charged and when it is draining. Therefore, if the remaining amount of charge is regarded as the remaining life of the battery, the amount of power is to be rapidly reduced when the battery is draining, thereby causing an unexpected power shortage. Such a problem may be avoided by calculating the remaining amount of charge, and by stopping using the battery when the remaining amount of charge reaches a prefixed value of 0. However, this means that the energy of the secondary battery is not fully used, and this is not desirable in view of cost. In this embodiment, on the other hand, the remaining life of a secondary battery is estimated with a high accuracy without imposing any restriction on the energy available in the secondary battery by estimating the remaining power thereof as described above.

As to the amount of charge, the remaining amount may be calculated if the fully-charged amount and the present amount are both known. However, as to the amount of power, the remaining amount may not be appropriately calculated even by subtracting any load-consuming power from the power when the battery is fully charged. In this respect, as described above in the first embodiment, a discharge curve is estimated by subtracting a polarization-voltage curve from an open-circuit voltage curve so that the remaining power is appropriately estimated considering a voltage decrease by internal resistance of the secondary battery 2, i.e., considering a polarization voltage.

Moreover, for estimating a discharge curve, if no consideration is given to the dependence thereof on the current and temperature, the remaining power to be estimated based on the discharge curve may not be accurate enough. In this respect, in the first embodiment, the remaining power of the secondary battery 2 is estimated based on information about a polarization-voltage curve correlated with the current value and the temperature of the secondary battery 2 so that the remaining life of the secondary battery 2 is easily estimated with a high accuracy.

2. Second Embodiment

[Exemplary Configuration of Apparatus]

In the battery remaining-life estimation apparatus 10 in a second embodiment, the information stored in the memory 11 about a polarization-voltage curve is more specific than in the battery remaining-life estimation apparatus 10 described by referring to FIG. 1. FIG. 3 is a schematic diagram of parameters in a table stored in the memory 11 as an exemplary configuration of the battery remaining-life estimation apparatus 10 in the second embodiment.

As shown in FIG. 3, in the battery remaining-life estimation apparatus 10 in the second embodiment, the memory 11 stores information about a polarization-voltage curve, i.e., a plurality of typical parameters defining the shape of the polarization-voltage curve. To be specific, in FIG. 3, a group of parameters corresponding to a specific temperature and a specific current value, e.g., parameters $a_1$, $b_1$, $p_{111}$, $p_{112}$, and $p_{113}$ corresponding to a temperature $T_1$ and a current value $I_1$, defines the shape of a polarization-voltage curve corresponding to the temperature and the current value. Alternatively, in a group of parameters for any specific one polarization-voltage curve, a part thereof may be correlated only with a temperature, and the remaining part thereof may be correlated with both a temperature and a current value. For example, as shown in FIG. 3, in the group of parameters $a_1$, $b_1$, $p_{111}$, $p1_{112}$, and $p_{113}$, the parameters $a_1$ and $b_1$ may be correlated only with the temperature $T_1$, and the parameters $p_{111}$ to $p_{113}$ may be correlated with both the temperature $T_1$ and the current value $I_1$. Also in this case, in view of the fact that the information is about an entire group of parameters, i.e., about any one specific polarization-voltage curve, the parameters are considered as being correlated with both a current value and a temperature. The correlation of a group of parameters with a temperature and a current value is not restricted to the above. The varying number of parameters correlated with various values of temperature and current is also within the scope of the present disclosure. The number of parameters is not restrictive as long as a polarization-voltage curve is reproduced thereby.

The battery remaining-life estimation apparatus 10 in the second embodiment is so configured that the circuit 12 estimates a polarization-voltage curve based on a plurality of typical parameters correlated with a current value and a temperature of the secondary battery 2. When the memory 11 stores no group of parameters corresponding to the current value and the temperature of the secondary battery 2, the circuit 12 may perform interpolation, e.g., linear interpolation, to calculate any corresponding group of parameters.

[Exemplary Operation of Apparatus]

Figure 4:
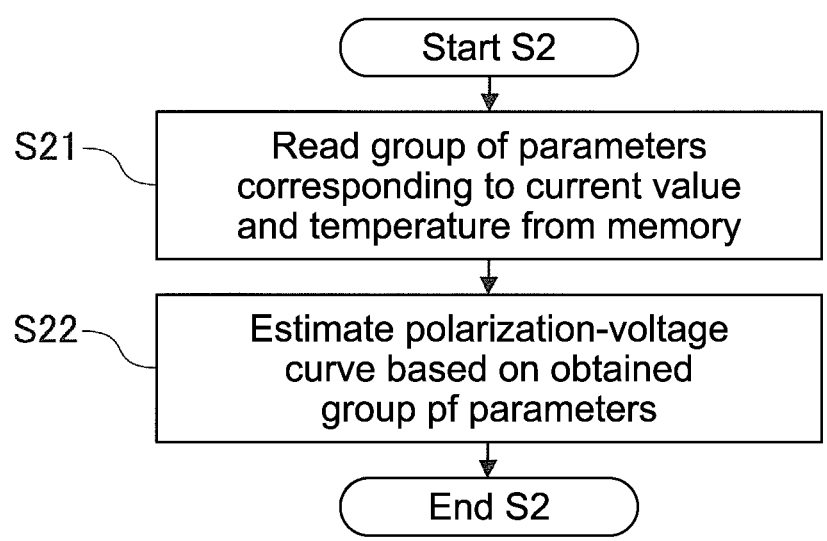
FIG. 4 is an exemplary operation flowchart of the battery remaining-life estimation apparatus in the second embodiment of the present disclosure.

FIG. 4 is an exemplary operation flowchart of the battery remaining-life estimation apparatus 10 in the second embodiment. The exemplary operation of FIG. 4 is a battery remaining-life estimation method in another embodiment of the present disclosure.

In the exemplary operation of FIG. 4, the process in step 2 (S2) is more specific than in FIG. 2. That is, in FIG. 4, a series of steps including step 21 (S21) and step 22 (S22) are performed in step 2 (S2).

To be specific, in step 21 (S21), the circuit 12 reads a group of parameters from the memory 11. The group of parameters is that corresponding to the current value and the temperature obtained in step 1 (S1) described by referring to FIG. 2.

In step 22 (S22), the circuit 12 estimates a polarization-voltage curve based on the group of parameters read in step 21 (S21).

The battery remaining-life estimation apparatus 10 in the second embodiment may produce the effect similar to that with the battery remaining-life estimation apparatus 10 of FIG. 1, or may save the memory capacity for a polarization-voltage curve.

3. First Modified Example of Second Embodiment

In the battery remaining-life estimation apparatus 10 in this modified example, information stored in the memory 11 about a polarization-voltage curve is different from that in the battery remaining-life estimation apparatus 10 described by referring to FIG. 3.

To be specific, as shown in FIG. 5, the information stored in the memory 11 about a polarization-voltage curve in this modified example is correlated not only with the current value and the temperature of the secondary battery 2 but also with a capacity retention thereof. To be more specific, in FIG. 5, in a group of parameters corresponding to a specific polarization-voltage curve, i.e., parameters $a_{11}$ $b_{11}$, $p_{1111}$, $p1_{1112}$, and $p_{1113}$, the parameters $a_{11}$ and $b_{11}$ are correlated with a temperature $T_1$ and a capacity retention $R_1$. The remaining parameters $p_{1111}$ to $p_{1113}$ are correlated with the temperature $T_1$, a current value $I_1$, and the capacity retention $R_1$, respectively. The memory 11 may store such a table as shown in FIG. 5 for each capacity retention, but this is not restrictive.

The circuit 12 is configured to read a group of parameters from the memory 11 for use to estimate a polarization-voltage curve. The group of parameters is that corresponding to the capacity retention of the secondary battery 2. The method to obtain the capacity retention is not restrictive. As an example, the capacity retention may be obtained by directly measuring a charging capacity by charging a fully-charged battery, or may be estimated by measuring the internal resistance based on a change of battery voltage against a change of charge-discharge current.

The battery remaining-life estimation apparatus 10 in this modified example may produce the effect similar to that with the battery remaining-life estimation apparatus 10 of FIG. 3, or may estimate the remaining power with a higher accuracy as is able to reproduce a polarization-voltage curve also considering the degree of deterioration of the secondary battery 2.

4. Third Embodiment

[Exemplary Configuration of Apparatus]

In the battery remaining-life estimation apparatus 10 in a third embodiment, a plurality of typical parameters defining the shape of a polarization-voltage curve are more specific than in the battery remaining-life estimation apparatus 10 described by referring to FIG. 3.

Figure 6:
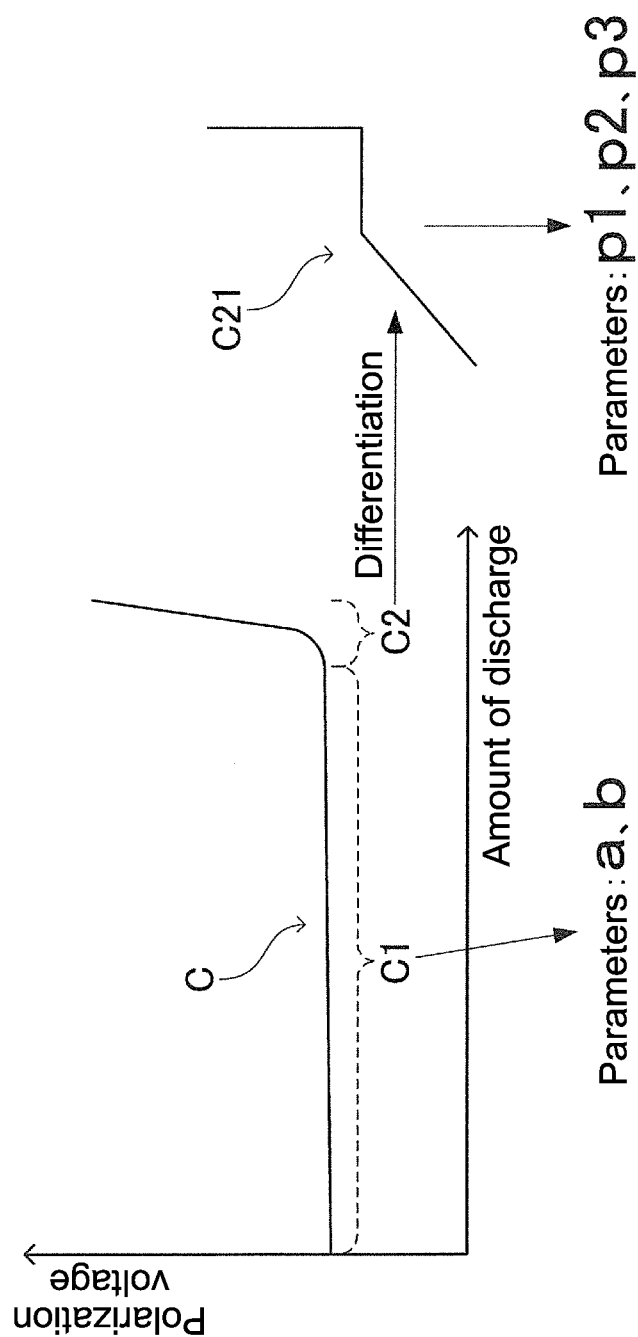
FIG. 6 is a schematic diagram of parameters stored in a memory as an exemplary configuration of a battery remaining-life estimation apparatus in a third embodiment of the present disclosure.

To be specific, as shown in FIG. 6, in this embodiment, the memory 11 stores parameters for a first curve portion C1 in a polarization-voltage curve C. The parameters include the proportional coefficient a of a component proportional to a discharge current, and a constant component b. The first curve portion C1 is a portion where a voltage change against a change in amount of charge is small. On the other hand, for a second curve portion C2 in the polarization-voltage curve C, the memory 11 stores parameters p1, p2, and p3. The second curve portion C2 is a portion where a voltage change against a change in amount of charge is large. The parameters p1 to p3 are those defining the shape of a curve C21 obtained by differentiating the second curve portion C2 with respect to the amount of charge. Hereinafter, the curve C21 is referred to as differential curve C21. The parameters p1 to p3 are corresponding to points on a graph in which the lateral axis indicates a charging rate [%], and the vertical axis indicates a derivative [V/Ah] obtained by differentiating the second curve portion C2 with respect to the amount of charge at a polarization voltage. Alternatively, the parameters p1 to p3 may correspond to points selected on the differential curve C21.

Hereinafter, the proportional coefficient a of the component proportional to the discharge current and the constant component b for the first curve portion C1 are referred to as first-curve-portion parameters as appropriate. Moreover, the parameters p1 to p3 defining the shape of the differential curve are referred to as second-curve-portion parameters. The first- and second-curve-portion parameters are not restricted in number to those shown in FIG. 6. For example, the number of the second-curve-portion parameters may be two, or four or more. In view of saving the memory capacity, the number of parameters may be reduced where possible as long as the polarization-voltage curve is satisfactorily reproduced thereby.

[Exemplary Operation of Apparatus]

Figure 7:
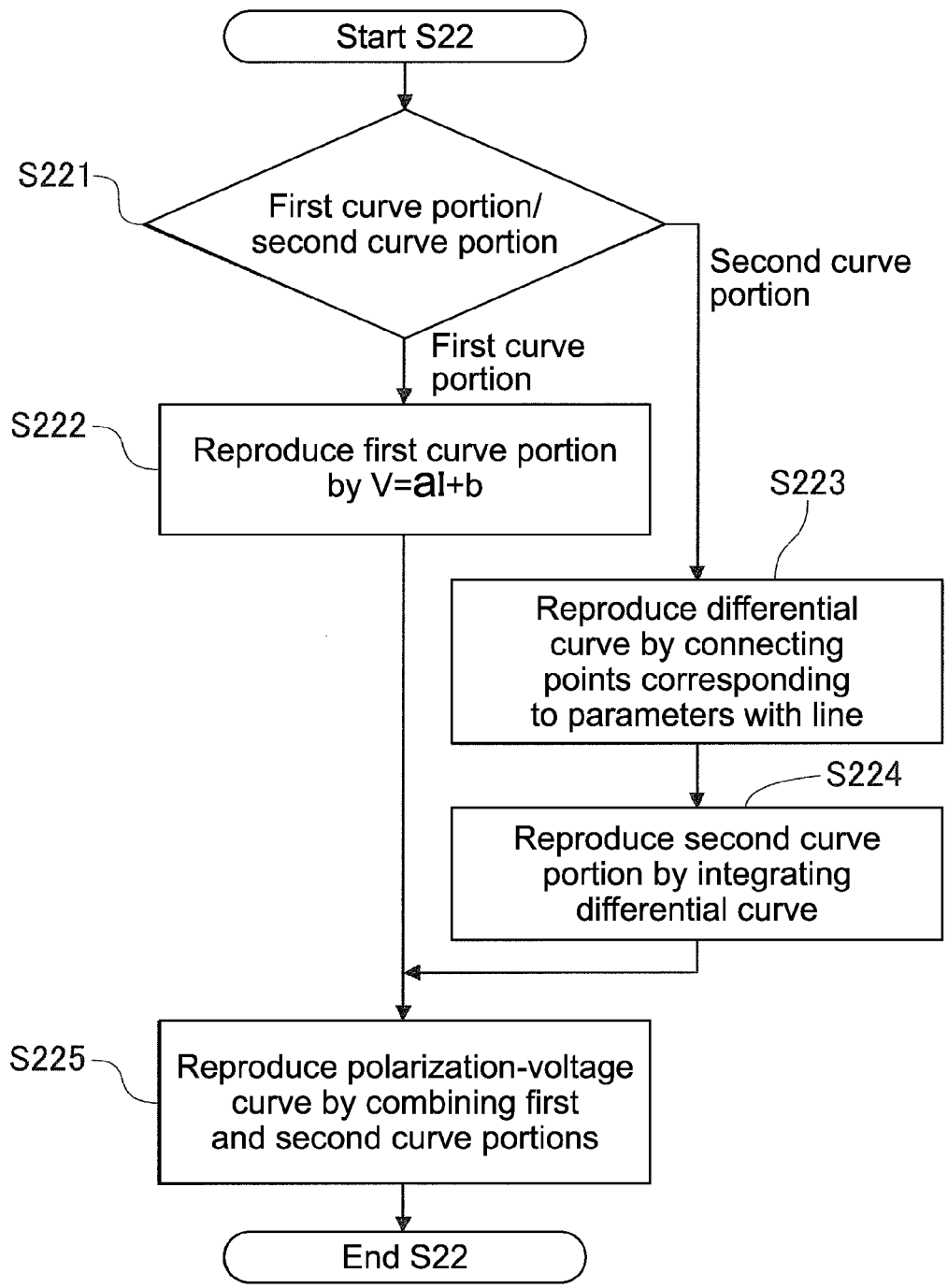
FIG. 7 is an exemplary operation flowchart of the battery remaining-life estimation apparatus in the third embodiment of the present disclosure.

FIG. 7 is an exemplary operation flowchart of the battery remaining-life estimation apparatus 10 in the third embodiment. The exemplary operation of FIG. 7 is a battery remaining-life estimation method in still another embodiment of the present disclosure.

In the exemplary operation of FIG. 7, the process in step 22 (S22) is more specific than in FIG. 4. That is, in FIG. 7, steps 221 (S221) to 225 (S225) are performed as step 22 (S22).

To be specific, in step 221 (S221), the procedure goes to step 222 (S222) as to the first-curve-portion parameters, and goes to step 223 (S223) as to the second-curve-portion parameters.

In step 222 (S222), the circuit 12 calculates the first curve portion by Equation below.

$$V = aI + b \quad \text{[Equation 2]}$$

In Equation above, V denotes a polarization voltage for the first curve portion, a denotes the proportional coefficient of a component proportional to a discharge current among the first-curve-portion parameters, b denotes a constant component in the first-curve-portion parameters, and I denotes the value of a discharge current [A] of the secondary battery 2.

After step 222 (S222), the procedure goes to step 225 (S225).

In step 223 (S223), the circuit 12 reproduces a differential curve for the second curve portion by connecting, with a line, points corresponding to the second-curve-portion parameters p1, p2, and p3. Thereafter, the procedure goes to step 224 (S224).

In step 224 (S224), the circuit 12 reproduces the second curve portion by integrating the differential curve reproduced in step 223 (S223). The procedure then goes to step 225 (S225).

In step 225 (S225), the circuit 12 reproduces the polarization-voltage curve by combining the first curve portion obtained by calculation in step 222 (S222) with the second curve portion obtained by calculation in step 224 (S224).

The battery remaining-life estimation apparatus 10 in the third embodiment may produce the effect similar to that with the battery remaining-life estimation apparatus 10 described by referring to FIG. 3, or may estimate a polarization-voltage curve very accurately with a small amount of data by storing a few parameters appropriate to the characteristics of a polarization voltage change. Note that integration is performed in this embodiment for reproducing the second curve portion. This integration does not much affect the computation load for the circuit 12 because data in use is discrete, and a process to be performed is only repeated addition.

5. First Modified Example of Third Embodiment

In the battery remaining-life estimation apparatus 10 in this modified example, the second-curve-portion parameters are more specific than in the battery remaining-life estimation apparatus 10 described by referring to FIG. 6.

Figure 8:
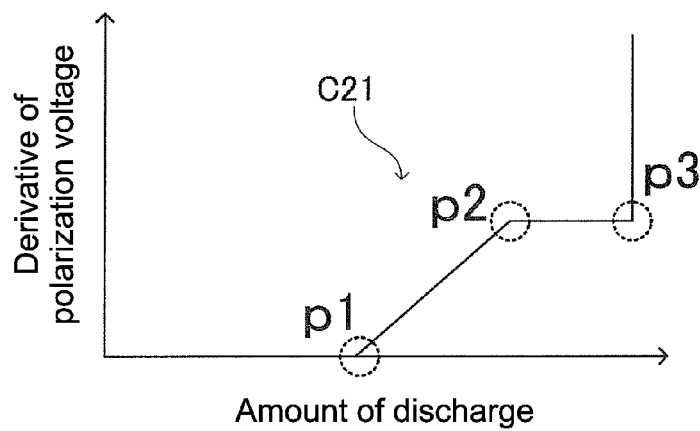
FIG. 8 is a schematic diagram of parameters stored in a memory as an exemplary configuration of a battery remaining-life estimation apparatus in a first modified example of the third embodiment of the present disclosure.

To be specific, in this modified example as shown in FIG. 8, the second-curve-portion parameters p1 to p3 define the characteristics of the differential curve C21. The characteristics of the differential curve C21 specifically include points thereof, e.g., end point, node, and inflection point.

The battery remaining-life estimation apparatus 10 in this modified example may produce the effect similar to that with the battery remaining-life estimation apparatus 10 described by referring to FIG. 6, or may reproduce more accurately and easily a polarization-voltage curve with a small amount of data.

6. Fourth Embodiment

[Exemplary Configuration of Apparatus]

In the battery remaining-life estimation apparatus 10 in a fourth embodiment, the parameters are more specific than in the battery remaining-life estimation apparatus 10 described by referring to FIG. 6.

With the battery remaining-life estimation apparatus 10 in this embodiment, the second-curve-portion parameters, i.e., information about a polarization-voltage curve, are partially determined based on a portion where a voltage change against a change in amount of charge is large in a polarization-voltage curve actually measured for the secondary battery 2. To be specific, the second-curve-portion parameters are those typically defining the shape of a curve obtained by linear approximation of a differential curve. This differential curve is one obtained by differentiating, with respect to the amount of charge, a portion where a voltage change against a change in amount of charge is large in a polarization-voltage curve actually measured for the secondary battery 2. To be more specific, the second-curve-portion parameters correspond to end points or nodes in the linear-approximated curve.

[Determination and Recording of Parameters]

Figure 9:
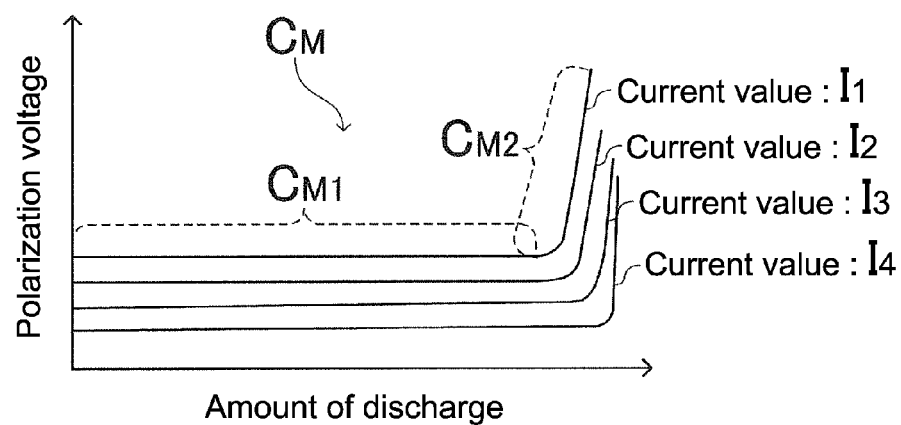
FIG. 9 is a schematic diagram showing polarization-voltage curves actually measured for a secondary battery in each state as an exemplary configuration of a battery remaining-life estimation apparatus in a fourth embodiment of the present disclosure.

Described below are processes to determine and record parameters in a battery remaining-life estimation method in this embodiment. As shown in FIG. 9, first of all, a polarization-voltage curve $C_M$ is actually measured for each different discharge current $I_1$, $I_2$, $I_3$, and $I_4$ ($I_1>I_2>I_3>I_4$) in a specific state of deterioration, i.e., with a specific capacity retention, and a specific temperature. FIG. 9 is a graph in which the lateral axis indicates an amount of discharge, and the vertical axis indicates a polarization voltage. In FIG. 9, assuming that the lateral axis is converted into a charging rate, the left side of the lateral axis is the charging rate of 100%, and the higher the value on the lateral axis, the less the charging rate becomes.

The measurement result of FIG. 9 shows that the polarization-voltage curves $C_M$ are each separated into components excepting a portion $C_{M2}$ of low charging rate, i.e., into a component proportional to a current, and a constant component. In consideration thereof, in this embodiment, for a portion $C_{M1}$ other than the low-charging-rate portion $C_{M2}$, i.e., a portion $C_{M1}$ corresponding to the first curve portion, the memory 11 stores only two parameters, i.e., the proportional coefficient a of a component proportional to the current, and a constant component b. Herein, the proportional coefficient a partially corresponds to the internal direct-current resistance and diffusion polarization. The constant component b corresponds to the remaining of the diffusion polarization.

Figure 10:
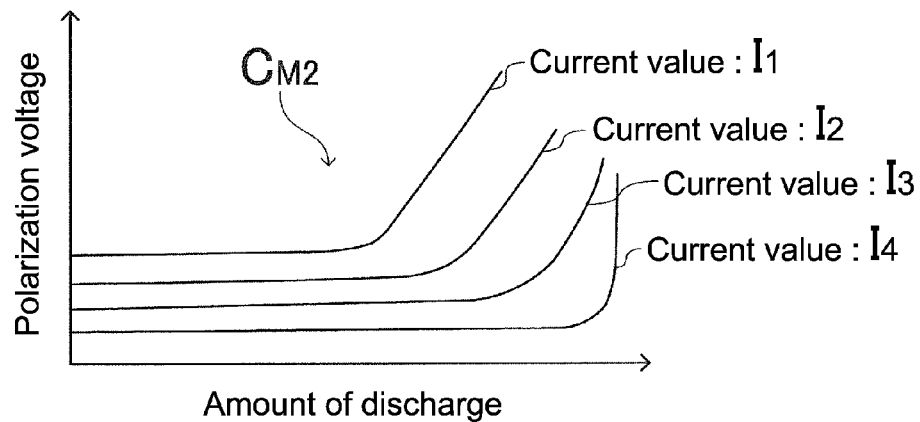
FIG. 10 is an enlarged view of the polarization-voltage curves of FIG. 9 where the amount of discharge is large.

FIG. 10 is an enlarged view of the polarization-voltage curves of FIG. 9 where the amount of discharge is large, i.e., the low-charging rate portion $C_{M2}$. When a battery is low in charging rate, i.e., when the battery is draining, the diffusion polarization is rapidly accelerated. As shown in FIG. 10, such acceleration of diffusion polarization when a battery is draining becomes noticeable with an increase of the discharge current, and the diffusion polarization becomes accelerated at a higher charging rate. This may be because the higher the discharge current, the more difficult early on for lithium to diffuse in an active material in time, and thus the lithium on the surface of the active material is depleted. This also may be because the extremely low temperature of a battery causes a reduction of the diffusion coefficient for lithium ion in an electrolytic solution. As a result, the lithium ion is reduced in concentration in a portion close to the cathode, thereby accelerating the diffusion polarization. As described above, because the diffusion polarization is a dynamic phenomenon, a polarization-voltage curve with a low charging rate is known in advance how the shape may be changed, but expressing the shape in numerical form is not easy.

Figure 11:
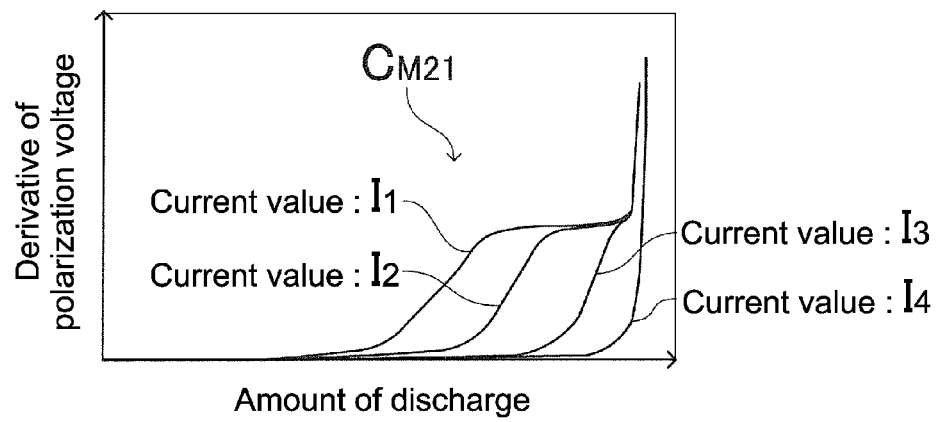
FIG. 11 is a schematic diagram showing the shape of curves that are obtained by differentiating the curves of FIG. 10.
Figure 12:
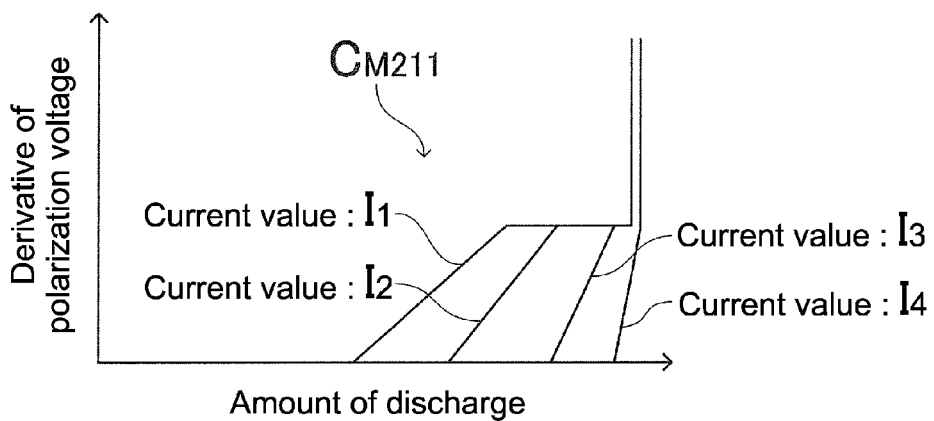
FIG. 12 is a schematic diagram showing the shape of graphs that are obtained by linear approximation of the curves of FIG. 11.
Figure 13:
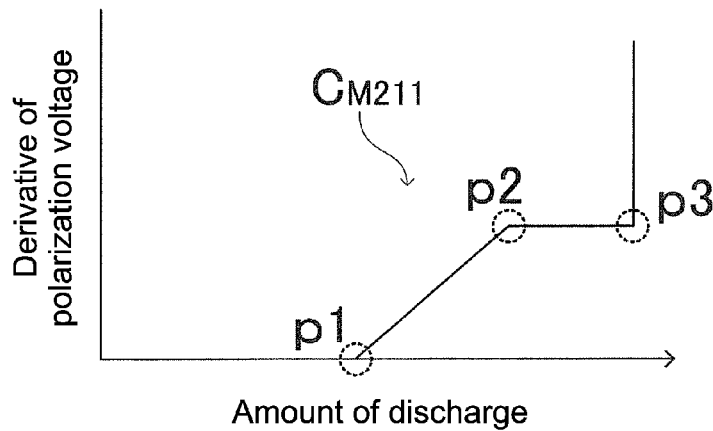
FIG. 13 is a schematic diagram showing parameters.

With the fact that the polarization voltage increases as a battery keeps discharging as described above, the present disclosure focuses attention on that the speed of change of the polarization voltage is known by differentiating the polarization voltage with respect to the amount of discharge. If the speed of change of polarization voltage is extremely increased, it may mean that lithium or lithium ion is depleted somewhere in the secondary battery 2. Therefore, it may say that the result obtained by differentiating the polarization voltage with respect to the amount of discharge is one reflecting the characteristics of the phenomenon of increasing the polarization voltage. To be specific, FIG. 11 shows a differential curve $C_{M21}$ that is obtained by differentiating the polarization voltage of the polarization-voltage curve of FIG. 10 with respect to the amount of discharge. The differential curve $C_{M21}$ of FIG. 11 has the characteristic shape indicating the phenomenon of increasing the polarization voltage. The differential curves $C_{M21}$ is then linearly approximated as shown in FIG. 12. FIG. 12 shows four graphs $C_{M211}$, and these graphs may be depicted like those in FIG. 13 when these are generalized, i.e., graphs with only three parameters being points p1, p2, and p3 (each enclosed by a dotted line) that are corresponding to end points or nodes on the graphs $C_{M211}$. For approximation in more detail, the number of parameters may be increased.

The above-mentioned parameters a, b, p1, p2, and p3 are stored in the memory 11 for every degree of deterioration, temperature, and current. To be specific, the proportional coefficient a and the constant component b may be stored for every degree of deterioration and temperature. If there are five standard degrees of deterioration and five standard values of temperature, the number of parameters to be stored is 25 each. The three parameters p1 to p3 defining the shape of the differential curve $C_{M21}$ are expected to be stored for every degree of deterioration, current, and temperature. If there are four standard current values, the number of parameters to be stored is 100 each. That is, the number of parameters to be stored is 350 in total, and if each of the parameters is 2 bytes, the capacity of 700 bytes will do. The memory area is thus reduced to one tenth or less compared with the case of storing a discharge curve for every value of current and temperature, e.g., Japanese Patent Application Laid-Open Publication No. 2002-295775.

For storing an open-circuit voltage curve for every degree of deterioration, if the open-circuit voltage curve is to be expressed with 20 points, it means that 100 points are expected to be stored for five standard degrees of deterioration. This case uses an extra storage capacity of 400 bytes if each point is a data pair of 2 bytes, but it still expects only 1.1 kilobytes in total with 700 bytes described above.

Determining the parameters and recording the parameters onto the memory 11 as described above may be automatically done by an electronic device, which is connected with the secondary battery 2 and a unit for measuring the state thereof, e.g., current, temperature, and voltage, but this is not restrictive.

In this embodiment, for determining the parameters, a curve to be linearly approximated is one obtained by differentiating a polarization-voltage curve with respect to the amount of charge. The approximation error in this case is equivalent to an error of linear approximation with a discharge curve or a polarization-voltage curve. As a specific example, what is considered now is a polarization-voltage curve including an approximation error only when it is with a specific amount of discharge of x1, where x denotes a variable indicating the amount of charge, and f(x) denotes a polarization-voltage curve. Assuming that the function g(x) is Δf when x=x1 but is 0 otherwise, the polarization-voltage curve including an approximation error is f(x)+g(x). That is, when x=x1, f(x1)+Δf is established, but otherwise it is f(x). Accordingly, when an error is summed on the basis of Δx, an error at the time of estimating the remaining capacity of a fully-charged battery becomes Δx×Δf. Herein, the error as a result of quantizing the capacity is ignored. On the other hand, a curve f'(x) including a similar error, i.e., a curve obtained by differentiating the polarization-voltage curve with respect to the amount of charge, is f'(x)+g(x)/Δx, and an integration result thereof with respect to x is f(x)+∫{g(x)/Δx}dx. With summation actually performed, when x=x1, established is f(x1)+Δx×Δf/Δx=f(x1)+Δf, or otherwise is f(x). Therefore, an approximation error at the time of estimating the remaining capacity of a fully-charged battery becomes $\Delta x \Delta f$. In consideration thereof, if any error as a result of quantizing the amount of charge is ignored, these curves are equivalent in terms of ease of including an approximation error.

The remaining capacity after quantization of the amount of charge, i.e., an error observed with the remaining power available for extraction is as below. That is, when the unit of f(x) is [V], for handling the remaining capacity with a resolution of [Wh], any error is ignored as long as $\Delta x$ is less than 1 Ah. Moreover, for handling the remaining capacity with a resolution of [mWh], any error is ignored as long as $\Delta x$ is less than 1 mAh.

[Exemplary Operation of Apparatus]

Figure 14:
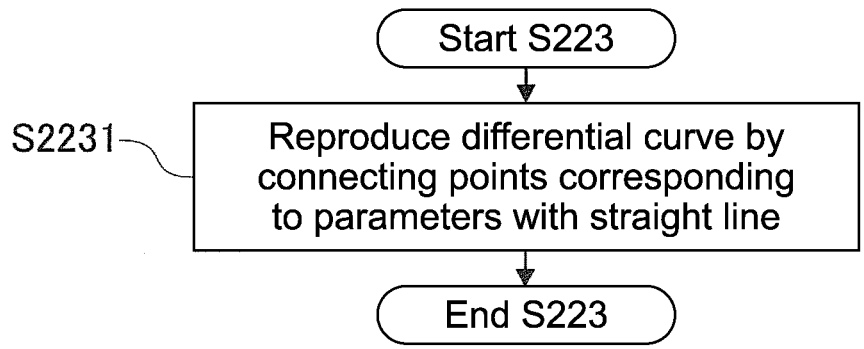
FIG. 14 is an exemplary operation flowchart of a battery remaining-life estimation apparatus in the fourth embodiment of the present disclosure.

FIG. 14 is an exemplary operation flowchart of the battery remaining-life estimation apparatus 10 in this embodiment. The exemplary operation of FIG. 14 is a battery remaining-life estimation method in still another embodiment of the present disclosure. In the battery remaining-life estimation method in this embodiment, processes of determining and recording parameters are included before the battery remaining-life estimation apparatus 10 operates as described above. The description below is about processes in the battery remaining-life estimation method in this embodiment when the battery remaining-life estimation apparatus 10 operates.

In the exemplary operation of FIG. 14, the process in step 223 (S223) is more specific than in FIG. 7. That is, in FIG. 14, a process in step 2231 (S2231) is performed as a specific example of the process in step 223 (S223). To be specific, in step 2231 (S2231), the circuit 12 reproduces a differential curve by connecting, with a straight line, points corresponding to the second-curve-portion parameters p1, p2, and p3, respectively.

The battery remaining-life estimation apparatus 10 in this embodiment may produce the effect similar to that with the battery remaining-life estimation apparatus 10 described by referring to FIG. 6, or may further reduce the number of parameters and the computation load with the second curve portion.

7. Fifth Embodiment

[Exemplary Configuration of Apparatus]

Compared with the battery remaining-life estimation apparatus 10 described by referring to FIG. 1, the battery remaining-life estimation apparatus 10 in a fifth embodiment performs differently the method for polarization-voltage curve estimation. To be specific, the battery remaining-life estimation apparatus 10 in this embodiment is configured to estimate the remaining power of the secondary battery 2 based on an estimated temperature change thereof. The temperature change of the secondary battery 2 may be estimated by the circuit 12.

To be more specific, when a charge-discharge schedule is specific, and when the heat transfer coefficient of the secondary battery 2 is substantially constant, known is a temporal change of current and temperature of the secondary battery 2. The circuit 12 may estimate a temporal change of current and temperature using the charge-discharge schedule as an input value. The temporal change of current may be the charge-discharge schedule itself, but this is not restrictive. As an example, the temperature may be estimated using data about the relationship between a current value and a temperature actually measured in advance, or by calculation with a relational expression for the current, the heat transfer coefficient, and temperature, but this is not restrictive. The circuit 12 may change the parameters for use in the memory 11 to respond to the estimated temporal change of temperature. The circuit 12 may change the parameters for use in the circuit 12 so as to respond also to the estimated temporal change of current. The polarization-voltage curve to be reproduced based on such parameters may include polarization-voltage-curve segments for every section of a predetermined width along the lateral axis, i.e., amount of discharge. The polarization-voltage-curve portions are each corresponding to a different temperature and current. That is, the polarization-voltage curve may be a combination of a plurality of polarization-voltage-curve portions.

[Exemplary Operation of Apparatus]

Figure 15:
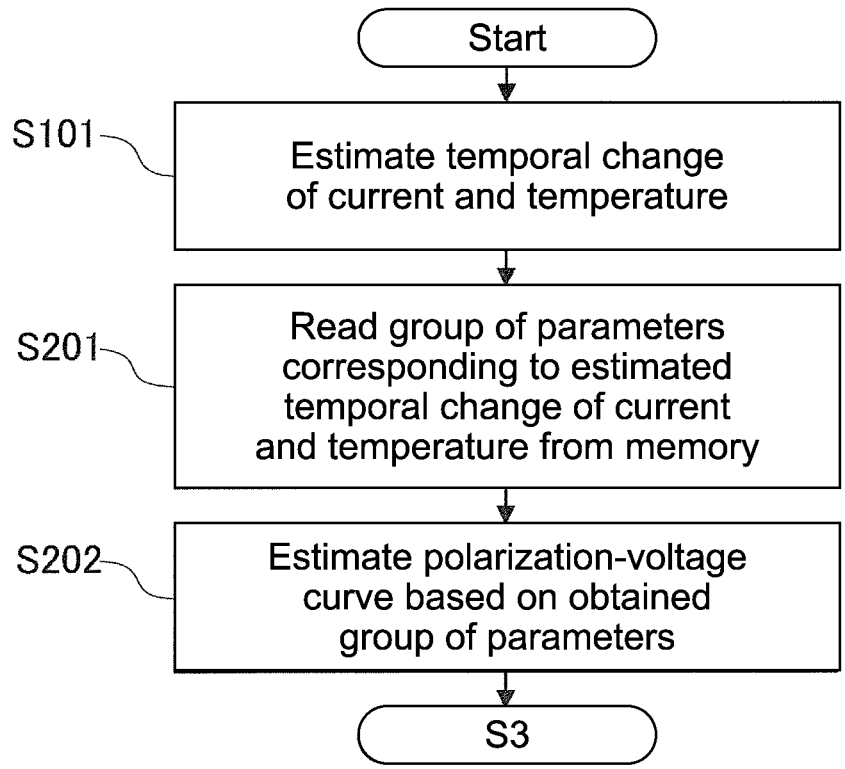
FIG. 15 is an exemplary operation flowchart of a battery remaining-life estimation apparatus in a fifth embodiment of the present disclosure.

FIG. 15 is an exemplary operation flowchart of the battery remaining-life estimation apparatus 10 in this embodiment. The exemplary operation of FIG. 15 is a battery remaining-life estimation method in still another embodiment of the present disclosure.

In the exemplary operation of FIG. 15, the process before step 2 (S2) is different from that of FIG. 2. To be specific, in FIG. 15, a process in step 101 (S101) is performed as an alternative to the process in step 1 (S1) of FIG. 2. Also in FIG. 15, a series of steps including step 201 (S201) and step 202 (S202) are specifically performed in step 2 (S2) of FIG. 1.

In step 101 (S101), the circuit 12 refers to the charge-discharge schedule to estimate a temporal change of current and temperature of the secondary battery 2. The charge-discharge schedule may be stored in a storage device such as the memory 11.

In step 201 (S201), the circuit 12 reads a group of parameters from the memory 11. This group of parameters is one corresponding to a temporal change of current and temperature estimated in step 101 (S101).

In step 202 (S202), the circuit 12 estimates a polarization-voltage curve based on the group of parameters read in step 201 (S201).

The battery remaining-life estimation apparatus 10 in this embodiment may produce the effect similar to that with the battery remaining-life estimation apparatus 10 described by referring to FIG. 1, or may estimate more accurately the remaining power.

8. Sixth Embodiment

In the battery remaining-life estimation apparatus 10 in a sixth embodiment, the circuit 12 is configured differently from that in the battery remaining-life estimation apparatus 10 described by referring to FIG. 1. To be specific, the circuit 12 in this embodiment is configured to obtain a polarization-voltage curve based on information about current and temperature of the secondary battery 2, which is obtained by communication.

Figure 16:
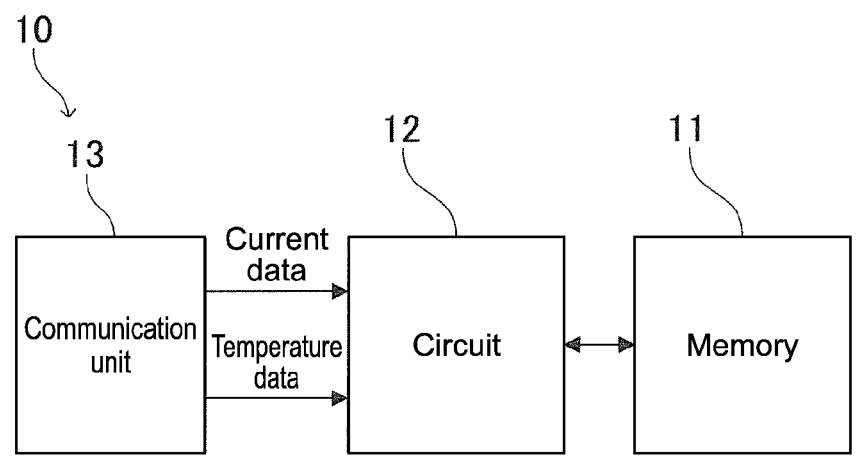
FIG. 16 is a block diagram schematically showing an exemplary configuration of a battery remaining-life estimation apparatus in a sixth embodiment of the present disclosure.

FIG. 16 shows an exemplary configuration in more detail. As shown in FIG. 16, the battery remaining-life estimation apparatus 10 in this embodiment includes a communication unit 13 connected to the circuit 12. The circuit 12 receives data about current and temperature of the secondary battery 2 by communication via the communication unit 13. The circuit 12 then reads information from the memory 11 about a polarization-voltage curve corresponding to the received data about current and temperature, and calculates the polarization-voltage curve based on the obtained information. Alternatively, the circuit 12 may receive, via the communication unit 13, data about voltage of the secondary battery 2. If this is the configuration, the received voltage data may be used to estimate an open-circuit voltage curve, for example.

The battery remaining-life estimation apparatus 10 may be disposed away from the secondary battery 2. The circuit 12 may be connected over a network for communication with a provider of information about the secondary battery 2.

The network may be an external network, for example. The external network may be the Internet, for example. The circuit 12 may be a server on the Internet, for example. How the circuit 12 receives the information about the secondary battery 2 is not restrictive, and what route the circuit 12 uses to receive the information about the secondary battery 2 is also within the scope of the present disclosure for the battery remaining-life estimation apparatus. The communication mode or others for the communication unit 13 are also not restrictive, and various types of communication unit may be used and connected with an information provider for communication. The communication unit 13 may be provided in the circuit 12.

The provider of information about the secondary battery 2 may be a communication unit provided on the secondary battery 2 side, or a computer on a network carrying the information about the secondary battery 2, for example, but this is not restrictive. A trigger for establishing the connection for communication is also not restrictive. As an example, the circuit 12 side may ask the provider for information about the secondary battery 2, and the provider may respond to the request. Alternatively, the provider may continuously or periodically transmit information about the secondary battery 2 to the circuit 12 side.

The battery remaining-life estimation apparatus 10 in this embodiment may produce the effect similar to that with the battery remaining-life estimation apparatus 10 described by referring to FIG. 1, or using only one circuit 12, may estimate the remaining life of the secondary battery 2 irrespective of where the battery is disposed.

9. Seventh Embodiment

[Capacitor 700]

Figure 17:
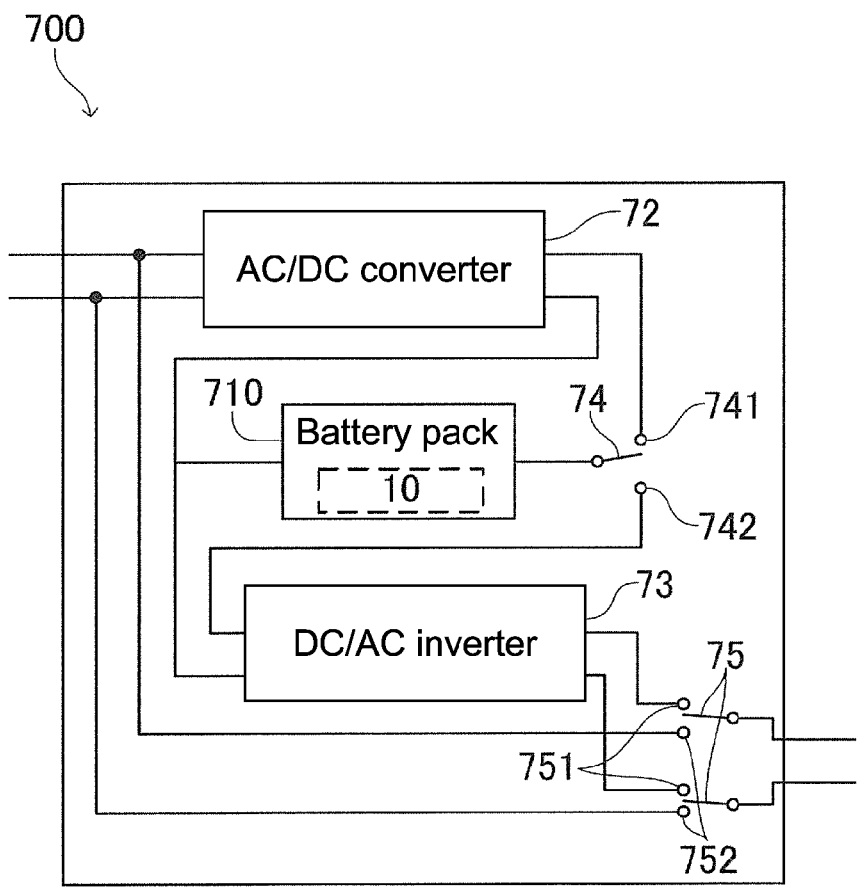
FIG. 17 is a block diagram showing an exemplary configuration of a capacitor in a seventh embodiment of the present disclosure.

FIG. 17 is a block diagram showing an exemplary circuit configuration when the battery remaining-life estimation apparatus 10 in a seventh embodiment is applied to a capacitor 700. As shown in FIG. 17, the capacitor 700 includes a battery pack 710 using the battery remaining-life estimation apparatus 10, an Alternating-Current/Direct-Current converter (AC/DC converter) 72, a DC/AC inverter 73, a switch 74, and an interlock switch 75. In the AC/DC converter 72, an input terminal is connected to a power supply that is not shown. The power supply may be a commercial power supply for in-house use, for example. In the AC/DC converter 72, a first output terminal is connected to a first electric contact 741 of the switch 74, and a second output terminal is connected to both an input terminal of the battery pack 710 and a first input terminal of the DC/AC inverter 73. In the battery pack 710, an output terminal is connected to the switch 74. In the DC/AC inverter 73, a second input terminal is connected to a second electric contact 742 of the switch 74, and an output terminal is connected to a first electric contact pair 751 of the interlock switch 75. In the interlock switch 75, a second electric contact pair 752 is connected to the power supply. The interlock switch 75 is connected on the output end with a power consumption device that is not shown, i.e., load.

The power consumption device may be an electronic device. The electronic device is not specifically restrictive, and is exemplified by a notebook personal computer, a PDA (Personal Digital Assistant), a mobile phone, a cordless handset, a video movie (trade mark), a digital still camera, an electronic book, an electronic dictionary, a music player, a radio, a headphone, a game console, a navigation system, a memory card, a pacemaker, a hearing aid, an electric tool, an electric shaver, a refrigerator, an air conditioner, a television set, a stereo, a hot water heater, a microwave oven, a dish washer, a washing machine, a drier, a light fixture, a toy, a medical device, a robot, a load conditioner, and a traffic light. That is, the capacitor 700 may be for stationary use or for mobile use.

The capacitor 700 is able to supply power in the battery pack 710 to such a load as above. This power supply is made through a connection of the switch 74 to the second electric contact 742, and a connection of the interlock switch 75 to the first electric contact pair 751. Such a power supply to the load may be made during certain time periods, e.g., during daytime hours, by using a clock or others, but this is not restrictive. The capacitor 700 directly connects the load to the power supply by turning off the switch 74, and by connecting the interlock switch 75 to the second electric contact pair 752. This allows a direct supply of power from the power supply to the load. Such a direct connection between the power supply and the load may be established when the remaining power in the battery pack 710 reaches a threshold value or lower, but this is not restrictive. The capacitor 700 charges the battery pack 710 by connecting the switch 74 to the first electric contact 741, and by connecting the interlock switch 75 to the second electric contact pair 752. This charging may be done during night hours, but this is not restrictive.

The operation of the switches 74 and 75 may be controlled by the battery pack 710 or by a control circuit other than the battery pack 710. The switches 74 and 75 are both not specifically restrictive, and may be semiconductor switches such as transistors.

[Battery Pack 710]

Figure 18:
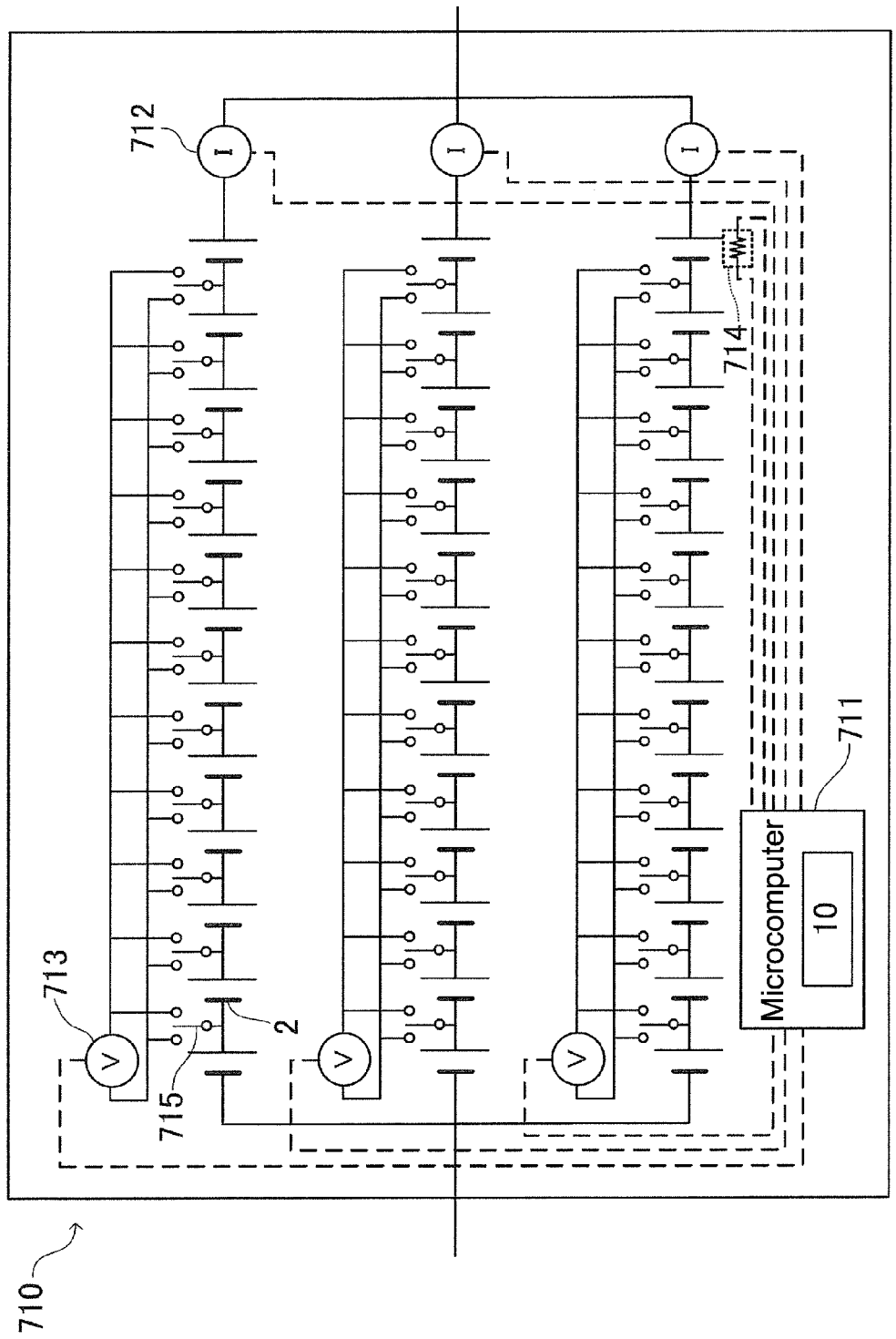
FIG. 18 is a block diagram showing an exemplary configuration of a battery pack in the capacitor of FIG. 17.

FIG. 18 is a block diagram showing an exemplary circuit configuration of the battery pack 710 of FIG. 17. As shown in FIG. 18, the battery pack 710 includes a microcomputer 711 including the battery remaining-life estimation apparatus 10, the secondary batteries 2, ammeters 712, voltmeters 713, a thermistor 714, and switches 715. Herein, FIG. 18 representatively shows only one thermistor 714.

To be more specific, the battery pack 710 of FIG. 18 includes 36 pieces of the secondary battery 2 in total, i.e., 12 pieces of the secondary battery 2 are connected in series, and three of such a row of the secondary batteries 2 are connected in parallel. The battery pack 710 includes three of the ammeter 712 in total. The ammeters 712 are connected in series to the three rows of the secondary batteries 2, respectively. The battery pack 710 includes three of the voltmeter 713 in total. The voltmeters 713 are connectable in parallel to the three rows of the secondary batteries 2, respectively. To be specific, between a pair of the voltmeter 713 and the row of the secondary batteries 2, a group of the switches 715 is provided. By turning ON and OFF the switches 715, the secondary batteries 2 in the corresponding row are to be measured in voltage one by one. The thermistor 714 is attached to each of the secondary batteries 2. These thermistors 714 each measure the surface temperature of the corresponding secondary battery 2.

The microcomputer 711 is connected to the ammeters 712, the voltmeters 713, and the thermistors 714. The microcomputer 711 is provided with information about in what state the secondary batteries 2 are, e.g., the measurement results from the ammeters 712, the voltmeters 713, and the thermistors 714. Based on the input results about the state of the secondary batteries 2, the microcomputer 711 is able to control charge/discharge of the secondary batteries 2, to protect the secondary batteries 2 from over-charging and over-discharging, and to estimate the degree of deterioration of the secondary batteries 2, for example.

The memory 11 of the battery remaining-life estimation apparatus 10 keeps track of the degree of deterioration of each of the secondary batteries 2 as capacity retention. Alternatively, the memory 11 may control the state of each of the secondary batteries 2 with a correlation with a battery number thereof, but this is not restrictive. The microcomputer 711 is able to estimate an open-circuit voltage curve with a capability of estimating the degree of deterioration, for example. The memory 11 stores an open-circuit voltage curve of the secondary battery 2 being brand new, and in the open-circuit voltage curve, the lateral axis indicates a charging rate, and the vertical axis indicates an open-circuit voltage. The memory 11 also stores the battery capacity of the secondary battery 2 being brand new. This thus leads to an open-circuit voltage curve in which the lateral axis indicates the amount of discharge, and the vertical axis indicates the open-circuit voltage by making a product of values correspond to 100% of the charging rate, i.e., a product of the battery capacity and the capacity retention.

The memory 11 stores parameters for every capacity retention and temperature. The parameters are relevant to the first curve portion of a polarization-voltage curve during discharging of the secondary battery 2, i.e., the proportional coefficient a of a component proportional to a discharge current, and a constant component b. The memory 11 also stores parameters relevant to the second curve portion of the polarization-voltage curve for every capacity retention, current, and temperature. These second-curve-portion parameters p1, p2, and p3 define the shape of a differential curve. The memory 11 also stores, for every temperature, the value of a charging rate on the boundary between the first and second curve portions. Such a value is hereinafter referred to as boundary SOC value.

Example

Described next is an exemplary operation of the capacitor 700 of FIG. 17 as Example of this embodiment.

In this Example, the memory 11 stores the parameters a, b, p1, p2, and p3 (refer to FIG. 13) relevant to a polarization-voltage curve with a correlation with five standard percentages of capacity retention, i.e., 100%, 95%, 90%, 85%, and 80%. Also in this Example, the memory 11 stores the parameters with a correlation with four standard values of discharge rate (current), i.e., 0.5 C, 1.0 C, 1.5 C, and 2.0 C. Also in this Example, the memory 11 stores the parameters with a correlation with five standard values of temperature, i.e., 0° C., 10° C., 20° C., 30° C., and 40° C. Also in this Example, 36 pieces of the secondary battery 2 of FIG. 18 are each a lithium-ion secondary battery cell with the capacity of 1500 mAh. Each of the battery cells has the capacity retention of 100% when it is brand new.

In this Example, when the fully-charged capacitor 700 starts discharging after it is connected with a household electrical appliance, the microcomputer 711 sums over time a read value of each of the ammeters 712. The resulting sum of the current values is negative because the flow of the current at the time of charging is opposite in direction. This sum of the current values is forced to be reset to 0 when the capacitor 700 becomes fully charged. This resetting may be done by the microcomputer 711, but this is not restrictive.

The microcomputer 711 also refers to the memory 11, and using the storage details therein, calculates the first-curve-portion parameters, i.e., the proportional coefficient a of a component proportional to a discharge current, and a constant component b. The storage details include the present capacity retention and temperature of each of the battery cells. Similarly, the microcomputer 711 calculates the second-curve-portion parameters using the capacity retention, temperature, and current. The parameters herein are the three parameters p1, p2, and p3 that define the shape of a differential curve. At this time, the microcomputer 711 calculates the boundary SOC value based on the temperature.

For a value calculation, exemplified here is a case where the capacity retention is 100%, the temperature is 25° C., and the discharge current rate is 0.8 C. In this case, the microcomputer 711 refers to the memory 11 to find the values corresponding to the capacity retention of 100% for the proportional coefficient a of the component proportional to the discharge current, and for the constant component b. The microcomputer 711 then reads numerical values corresponding to the temperature 20° C. and 30° C., and performs linear interpolation thereon so as to find a value corresponding to the temperature of 25° C. Assuming that a=78 mΩ and b=17 mV at the temperature of 20° C., and a=62 mΩ and b=10 mV at the temperature of 30° C., calculated for the temperature of 25° C. are a=70 mΩ and b=13.5 mV.

The microcomputer 711 also refers to the memory 11 to find the values corresponding to the capacity retention of 100% for the three parameters p1, p2, and p3 that define the shape of a differential curve. The microcomputer 711 then reads numerical values corresponding to the temperature 20° C. and 30° C. with each of the discharge current rates of 0.5 C and 1.0 C. The microcomputer 711 then performs linear interpolation on the values at the temperature 20° C. and 30° C. so as to find a value corresponding to the temperature of 25° C. with each of the discharge current rates of 0.5 C and 1.0 C. The calculation results are then subjected to linear interpolation again so as to derive a value corresponding to the discharge current rate of 0.8 C.

Herein, exemplified is a case where the SOC components in the three parameters p1 to p3 are respectively [11.3%, 6.7%, 3.3%] with the capacity retention of 100% and at the temperature of 20° C. with the discharge current rate of 0.5 C. Also exemplified is a case where the SOC components in the three parameters p1 to p3 are respectively [10.0%, 4.0%, 3.3%] with the capacity retention of 100% and at the temperature of 30° C. with the discharge current rate of 0.5 C. In these cases, the SOC components in the three parameters p1 to p3 are [10.7%, 5.4%, 3.3%] at the temperature of 25° C. with the discharge current rate of 0.5 C.

The SOC components in the three parameters p1 to p3 are assumed to be respectively [20.0%, 10.7%, 3.3%] with the capacity retention of 100% and at the temperature of 20° C. with the discharge current rate of 1.0 C. Moreover, the SOC components in the three parameters p1 to p3 are assumed to be respectively [10.0%, 4.0%, 3.3%] with the capacity retention of 100% and at the temperature of 30° C. with the discharge current rate of 1.0 C. In these cases, the SOC components in the three parameters p1 to p3 at the temperature of 25° C. with the discharge current rate of 0.5 C are respectively [15%, 7.4%, 3.3%]

The SOC components are then subjected to linear interpolation by the discharge current rates of 0.5 C and 1.0 C so as to calculate a value corresponding to the discharge current rate of 0.8 C. The resulting SOC components are [13.3%, 6.6%, 3.3%]. The polarization voltage for the parameter corresponding to 3.3% among these SOC components is differentiated with respect to the amount of charge. The resulting component (hereinafter, referred to as V/Ah component) is 10V/Ah. The V/Ah component for the parameter corresponding to 6.6% is 4V/Ah. The V/Ah component for the parameter corresponding to 13.3% is 0V/Ah. By connecting the points of these three parameters with a straight line, a differential curve is reproduced.

For calculating a boundary SOC value, the microcomputer 711 refers to the memory 11 to read numerical values corresponding to the temperature 20° C. and 30° C. The microcomputer 711 then performs linear interpolation on the obtained values so as to calculate a value corresponding to the temperature of 25° C. Assuming that a boundary SOC value at the temperature of 20° C. is 30%, and a boundary SOC value at the temperature of 30° C. is 20%, a boundary SOC value at the temperature of 25° C. is calculated to be 25%.

Figure 19:
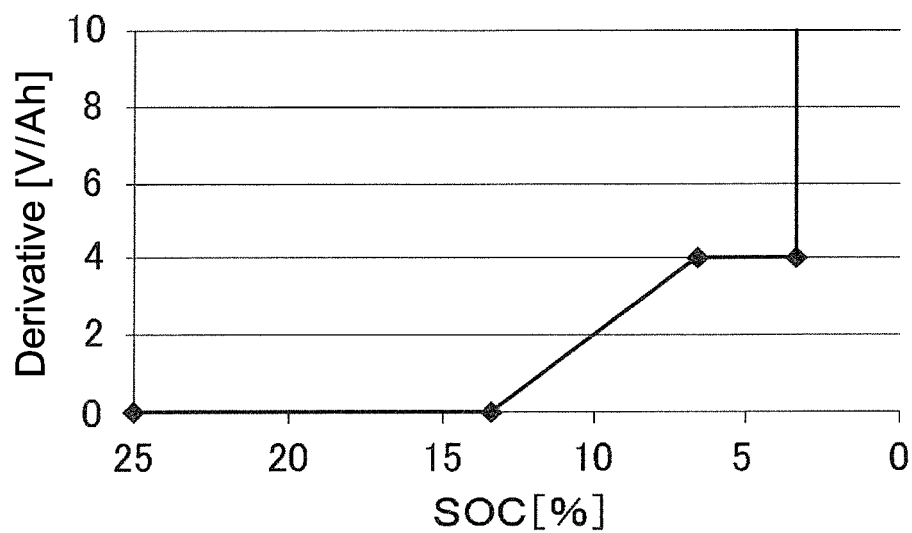
FIG. 19 is a graph being a differential curve of a polarization-voltage curve that is reproduced based on parameters by a capacitor operating as exemplified in Example of the present disclosure.
Figure 20:
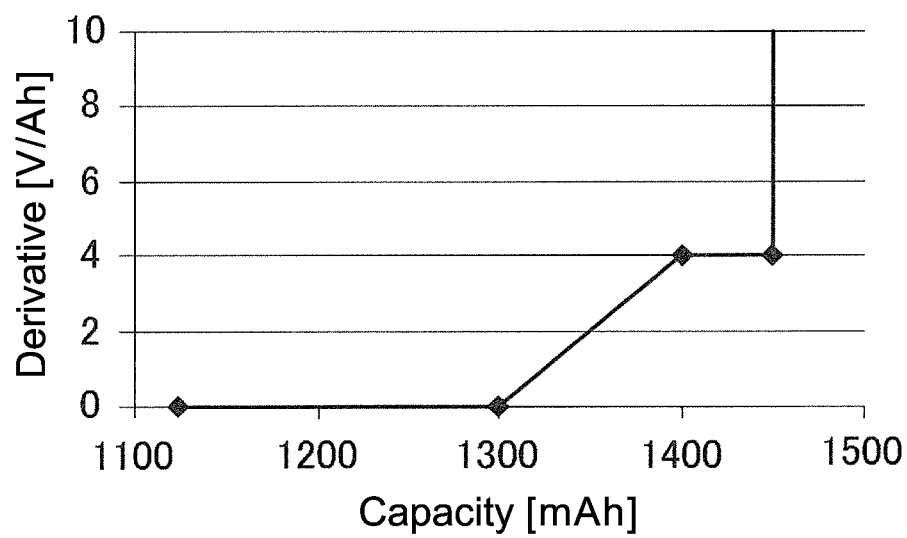
FIG. 20 is a graph in which the lateral axis in the graph of FIG. 19 is converted into capacity.

The differential curve reproduced from such information is one shown in FIG. 19. This battery cell has the capacity of 1500 mAh as described above, and thus converting the lateral axis into capacity obtains a graph of FIG. 20.

Figure 21:
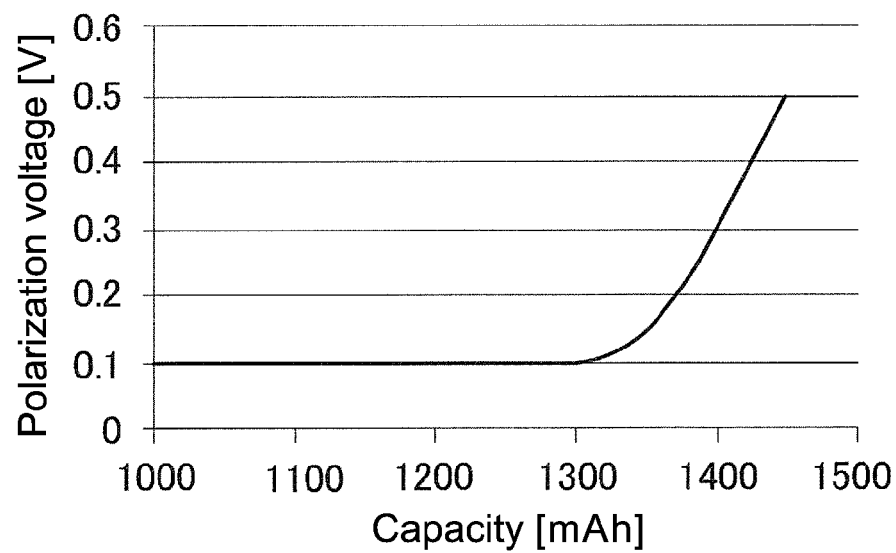
FIG. 21 is a graph being a polarization-voltage curve reproduced based on the graph of FIG. 19.
Figure 22:
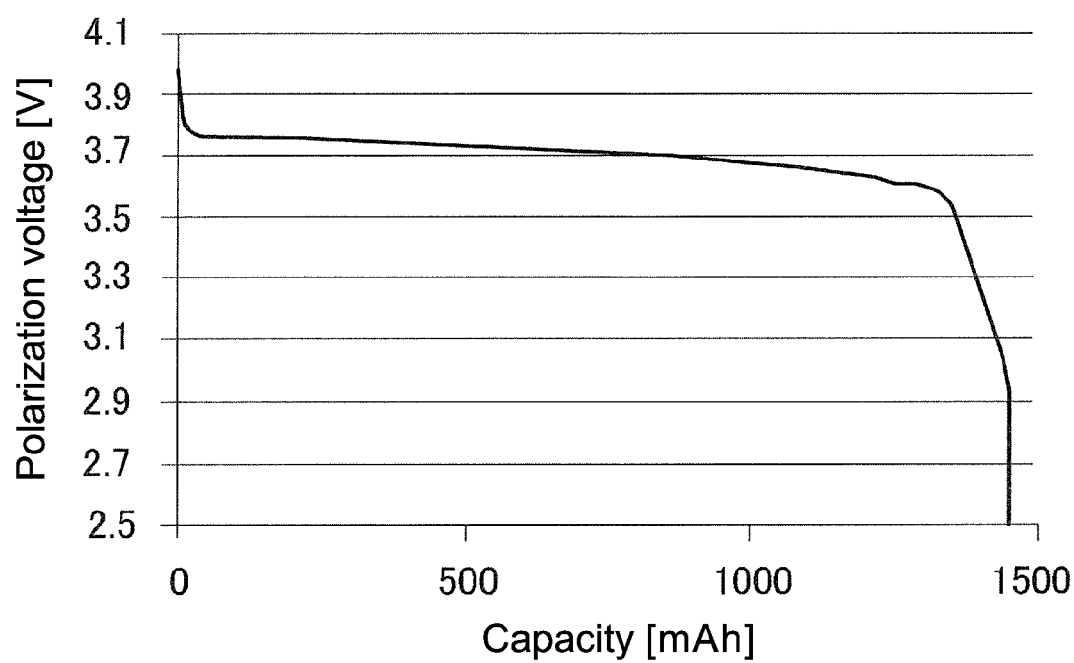
FIG. 22 is a graph being a discharge curve estimated based on the graph of FIG. 19.

The polarization voltage of the first curve portion is calculated to be 97.5 mV because of 70 [mΩ]×current value [A]+13.5 [mV], and 0.8 C=1.2 A. The polarization voltage of the second curve portion may be obtained by adding 97.5 mV to the result of integrating the reproduced differential curve. FIG. 21 shows the result. FIG. 22 shows an estimated discharge curve obtained by subtracting the resulting polarization-voltage curve from an open-circuit voltage curve.

The remaining power of the battery cell is the result obtained by integrating the segment of the estimated discharge curve, i.e., segment from the present total value of current to the discharge-ending voltage. The remaining power is estimated as above. Estimating the discharge curve once in a minute is desirable, for example, because a value change of current and temperature in a battery may cause a shape change of the discharge curve to be estimated.

The microcomputer 711 sums the current values, and at the same time, measures the internal resistance in each of the battery cells by reading the ammeters 712 and the voltmeters 713. With the information sufficient for estimating the degree of deterioration, the microcomputer 711 calculates the capacity retention for storage. Reflecting this result for estimating the above-mentioned discharge curve leads to accurate estimation of the remaining power even if the battery cells are further deteriorated. When the capacity retention is 87%, the microcomputer 711 performs the above-mentioned calculation by referring to the memory 11 to find the portion of the capacity retention of 90%. Thereafter, the microcomputer 711 performs the similar calculation by referring to the memory 11 to find the portion of the capacity retention of 85%. The resulting values are subjected to linear interpolation so as to find a value corresponding to the capacity retention of 87%, thereby being able to estimate the remaining power of any deteriorated battery cell.

The calculation in this Example estimates the remaining power of a battery cell when the present current and the temperature thereof remain the same until the end of discharging. Moreover, when the charge-discharge schedule is specific, and when the heat transfer coefficient of the battery is substantially constant, known is a temporal change of current and temperature of the battery cell. This allows estimation of a discharge curve that constantly changes. Using the resulting discharge curve leads to more accurate estimation of the remaining power of the battery cell.

According to the embodiment, with the battery remaining-life estimation apparatus 10, a battery pack and a capacitor become able to estimate the remaining life of a battery cell with a high accuracy. When the capacitor is for stationary use, this helps to produce an effect of easily making an operating schedule.

10. Eighth Embodiment

Figure 23:
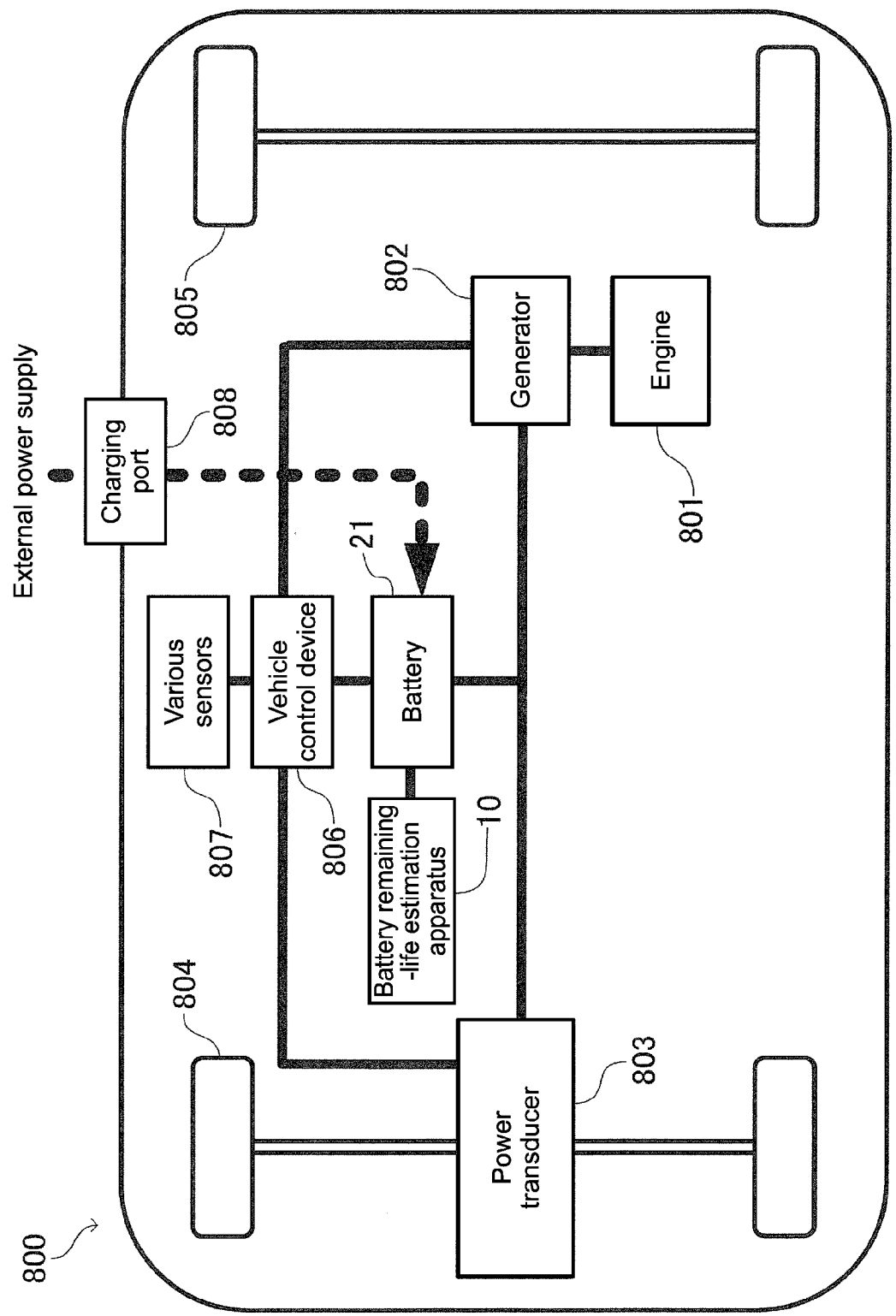
FIG. 23 is a block diagram showing an exemplary configuration of an electric vehicle in an eighth embodiment of the present disclosure.

FIG. 23 is a block diagram schematically showing an exemplary configuration of an electric vehicle, i.e., hybrid vehicle 800, using the battery remaining-life estimation apparatus 10 in an eighth embodiment. The hybrid vehicle 800 is an exemplary form of the electric vehicle. The electric vehicle is an exemplary form of a power consumption device. The hybrid vehicle 800 uses a series hybrid system. The series hybrid system drives a vehicle by a power transducer using power generated by an engine-driven generator. The hybrid vehicle 800 include an engine 801, a generator 802, a power transducer 803, driving wheels 804, wheels 805, a battery 21, a vehicle control device 806, various sensors 807, a charging port 808, and the battery remaining-life estimation apparatus 10. The battery 21 is an exemplary form of the secondary battery 2.

The hybrid vehicle 800 runs using the power transducer 803 as a power source. The power transducer 803 is a motor, for example. By the power in the battery 21 being discharged to the power transducer 803, the power transducer 803 is operated. The rotation force of this power transducer 803 is then transferred to the driving wheels 804. Herein, the power transducer 803 may be an AC motor or a DC motor. The various sensors 807 are for controlling the speed of the engine via the vehicle control device 806, or controlling the degree of opening of a throttle valve that is not shown, i.e., throttle opening angle. The various sensors 807 may include a speed sensor, an acceleration sensor, an engine speed sensor, and others.

In the hybrid vehicle 800, the rotation force of the engine 801 is transferred to the generator 802, and with the rotation force, the power generated by the generator 802 is accumulated in the battery 21. When the hybrid vehicle 800 is reduced in speed by a braking mechanism that is not shown, the resistance force at the time of deceleration is added as the rotation force to the power transducer 803. With this rotation force, the power transducer 803 may generate regenerative power, and may accumulate the power in the battery 21. Moreover, the battery 21 may be connected to an external power source of the hybrid vehicle 800, thereby being able to accumulate power provided from the power source through the charging port 808 as an input port.

The battery remaining-life estimation apparatus 10 estimates the remaining power of the battery 21 based on the state information about the battery 21 obtained from an ammeter, a thermometer, and a voltmeter that are not shown. The hybrid vehicle 800 may include an information processor that displays the estimated remaining power as the remaining life of the battery.

The electric vehicle in this embodiment may effectively be a parallel hybrid vehicle whose drive source is both an engine output and a motor output, and runs by a change of three modes as appropriate, i.e., runs only with an engine, runs only with a motor, and runs both with the engine and the motor. The electric vehicle in this embodiment may also effectively be a vehicle that runs without an engine but only by the driving force of a motor. The electric vehicle may also be a railroad car, a golf cart, an electric cart, and others.

This embodiment implements an electric vehicle that may very accurately estimate the remaining life of the battery 21 by including the battery remaining-life estimation apparatus 10. With the electric vehicle, any unexpected power shortage may be prevented before it occurs.

The embodiments and modified examples described above may be combined together as appropriate. Adding and replacing any component in an arbitrary embodiment or modified example to/from another is also within the scope of the present disclosure.

While the effects have been described in the embodiments and modified examples, the foregoing description is in all aspects illustrative and not restrictive. It is understood that any one of numerous other effects described in the embodiments and modified examples may be produced.

The present disclosure may be also in the following structures.

(1) A battery remaining-life estimation apparatus, including:

a memory configured to store information about a polarization-voltage curve of a secondary battery, the information being stored with a correlation with a current value and a temperature of the secondary battery; and a circuit configured to estimate a remaining power of the secondary battery, the remaining power being estimated based on a discharge curve of the secondary battery, and the circuit obtaining the polarization-voltage curve based on the information in the memory, the polarization-voltage curve being correlated with the current value and the temperature of the secondary battery, and estimating the discharge curve by subtracting the obtained polarization-voltage curve from an open-circuit voltage curve obtained for the secondary battery.

(2) The battery remaining-life estimation apparatus according to (1), in which the memory stores a plurality of typical parameters as the information about the polarization-voltage curve, the parameters defining a shape of the polarization-voltage curve, and the circuit estimates the polarization-voltage curve based on the typical parameters, the parameters being correlated with the current value and the temperature of the secondary battery.

(3) The battery remaining-life estimation apparatus according to (2), in which for a first curve portion of the polarization-voltage curve where a voltage change responding to a change in amount of charge is small, the memory stores a proportional coefficient and a constant component as the typical parameters, the proportional coefficient being of a component proportional to a discharge current, and for a second curve portion of the polarization-voltage curve where the voltage change is large, the memory stores a parameter defining a shape of a curve as the typical parameters, the curve being obtained by differentiating the second curve portion with respect to the amount of charge.

(4) The battery remaining-life estimation apparatus according to (3), in which as the parameter defining the shape of the curve obtained by differentiating the second curve portion with respect to the amount of charge, the memory stores a parameter defining a characteristic of the shape of the curve obtained by differentiating the second curve portion with respect to the amount of charge.

(5) The battery remaining-life estimation apparatus according to any one of (1) to (4), in which the memory stores the information about the polarization-voltage curve also with a correlation with a capacity retention of the secondary battery.

(6) The battery remaining-life estimation apparatus according to any one of (1) to (5), in which the circuit estimates the remaining power based on an estimated temperature change of the secondary battery.

(7) The battery remaining-life estimation apparatus according to any one of (1) to (6), in which the circuit obtains the polarization-voltage curve based on current and temperature information of the secondary battery, the information being obtained by communication.

(8) A battery remaining-life estimation program causing a computer (circuit 12)

to obtain a polarization-voltage curve corresponding to a current value and a temperature of a secondary battery based on information thereabout stored in a memory, the information being stored with a correlation with the current value and the temperature of the secondary battery, to estimate a discharge curve of the secondary battery by subtracting the obtained polarization-voltage curve from an open-circuit voltage curve obtained for the secondary battery, and to estimate a remaining power of the secondary battery based on the discharge curve.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A battery remaining-life estimation apparatus, comprising:

a memory configured to store a plurality of parameters defining a shape of a polarization-voltage curve, wherein the plurality of parameters includes a first parameter associated only with a temperature value of a battery and a second parameter associated both with the temperature value and a current value of the battery; and a processor configured to obtain an open-circuit voltage curve of the battery and to obtain the polarization-voltage curve based on the plurality of parameters stored in the memory, wherein the processor is configured to control the battery to supply a power to a connected power consumption device, wherein the processor is configured to estimate a remaining power amount of the secondary battery based on a discharge curve, and wherein the discharge curve is obtained by subtracting the polarization-voltage curve from the open-circuit voltage curve of the secondary battery, and wherein the polarization-voltage curve includes a first curve portion and a second curve portion, and wherein the first curve portion satisfies an equation 1:

$$V = aI + b \quad \text{(equation 1)}$$

wherein a is a coefficient proportional to a discharge current, b is a constant component corresponding to the remaining of the diffusion polarization, I is a value of a discharge current of the battery, and V is a polarization voltage; wherein for the second curve portion, the memory stores a parameter defining a shape of a curve as typical parameters, the curve being obtained by differentiating the second curve portion with respect to the amount of charge; and wherein when determining the discharge curve, the second curve portion is reproduced by integrating the differential curve stored in the memory.

2. The battery remaining-life estimation apparatus according to claim 1, wherein
for the first curve portion of the polarization-voltage curve where a voltage change responding to a change in amount of charge is small, the memory stores a proportional coefficient and a constant component as typical parameters, the proportional coefficient being of a component proportional to a discharge current, and
for the second curve of the polarization voltage curve is where the voltage change is large.

3. The battery remaining-life estimation apparatus according to claim 1, wherein
the memory stores the information about the polarization-voltage curve also with a correlation with a capacity retention of the secondary battery.

4. The battery remaining-life estimation apparatus according to claim 1, wherein
the processor estimates the remaining power based on an estimated temperature change of the secondary battery.

5. The battery remaining-life estimation apparatus according to claim 1, wherein
the processor obtains the polarization-voltage curve based on current and temperature information of the secondary battery, the information being obtained by communication.

* * * * *